(12) United States Patent
Levermore et al.

(10) Patent No.: US 8,836,223 B2
(45) Date of Patent: Sep. 16, 2014

(54) OLED PANEL WITH FUSES

(75) Inventors: Peter Levermore, Lambertville, NJ (US); Huiqing Pang, Newtown, PA (US); Kamala Rajan, Newtown, PA (US)

(73) Assignee: Universal Display Corporation, Ewing, NJ (US)

( * ) Notice: Subject to any disclaimer, the term of this patent is extended or adjusted under 35 U.S.C. 154(b) by 114 days.

(21) Appl. No.: 13/590,081

(22) Filed: Aug. 20, 2012

(65) Prior Publication Data

US 2013/0278144 A1 Oct. 24, 2013

Related U.S. Application Data

(60) Provisional application No. 61/635,123, filed on Apr. 18, 2012.

(51) Int. Cl.
*H05B 37/00* (2006.01)
*H01J 9/00* (2006.01)

(52) U.S. Cl.
USPC .......................... 315/169.3; 315/121; 345/76

(58) Field of Classification Search
USPC .......... 315/121, 169.1, 169.3; 345/36, 45, 80, 345/76
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 7,279,704 B2 | 10/2007 | Walters et al. | |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Daniel D Chang
(74) *Attorney, Agent, or Firm* — Sterne, Kessler, Goldstein & Fox P.L.L.C.

(57) ABSTRACT

Embodiments may provide a first device that may comprise a substrate, a plurality of conductive bus lines disposed over the substrate, and a plurality of OLED circuit elements disposed on the substrate, where each of the OLED circuit elements comprises one and only one pixel electrically connected in series with a fuse. Each pixel may further comprise a first electrode, a second electrode, and an organic electroluminescent (EL) material disposed between the first and the second electrodes. The fuse of each of the plurality of OLED circuit elements may electrically connect each of the OLED circuit elements to at least one of the plurality of bus lines. Each of the plurality of bus lines may be electrically connected to a plurality of OLED circuit elements that are commonly addressable and at least two of the bus lines may be separately addressable.

20 Claims, 16 Drawing Sheets

(56) References Cited

U.S. PATENT DOCUMENTS

| | | |
|---|---|---|
| 7,431,968 B1 | 10/2008 | Shtein et al. |
| 2003/0230980 A1 | 12/2003 | Forrest et al. |
| 2004/0174116 A1 | 9/2004 | Lu et al. |
| 2012/0181933 A1* | 7/2012 | Ma et al. .................. 315/121 |

OTHER PUBLICATIONS

Baldo et al., "Very high-efficiency green organic light-emitting devices based on electrophosphorescence," Appl. Phys. Lett., vol. 75, No. 3, 4-6 (1999).

U.S. Appl. No. 61/635,123, filed Apr. 18, 2012.

\* cited by examiner

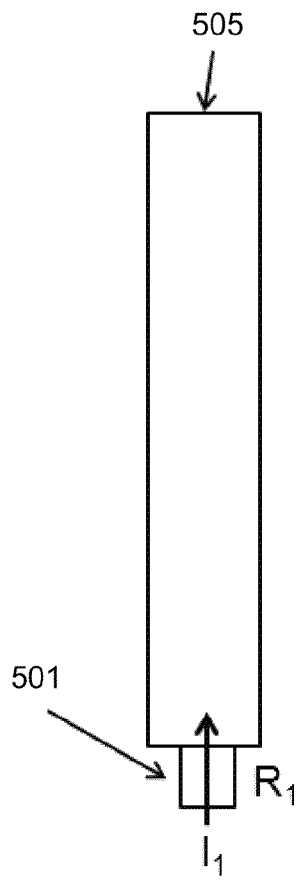
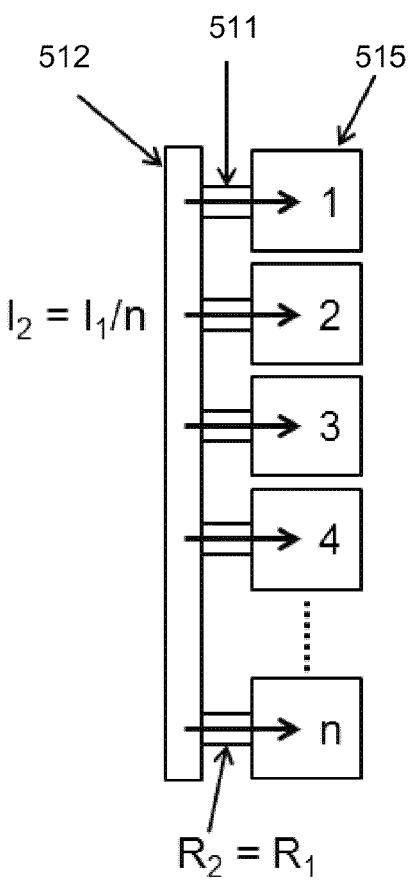
Power Loss = $I_1^2 R_1$       Power Loss = $n \times I_2^2 R_2 = I_1^2 R_1 / n$
FIG. 5(a)       FIG. 5(b)

OLED PANEL WITH FUSES

This application claims priority to U.S. Provisional Application Ser. No. 61/635,123, filed Apr. 18, 2012, the contents of which are expressly incorporated fully herein by reference in its entirety.

This invention was made with government support under DE-EE0004534 awarded by the Department of Energy. The government has certain rights in the invention.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris (2-phenylpyridine) iridium, denoted Ir(ppy)3, which has the structure of Formula I:

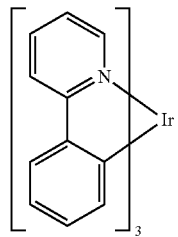

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OF THE INVENTION

Embodiments provided herein may comprise devices, and/or methods of manufacturing devices, that comprise a plurality of OLEDs that are electrically connected to one or more fuses that are integrated into the device to protect the device and/or individual OLEDs from electrical shorts. The device may comprise a plurality of bus lines and a plurality of individual lighting pixels that may each be connected to one of the bus lines by one or more fuses. Each of the pixels connected to a bus line may be commonly addressable and at least two of the plurality of bus lines may be separately addressable (i.e. "individually addressable"). In this way, embodiments may thereby provide a color tunable or dimmable device (such as a lighting panel) that also comprises fuses to protect or reduce the effect of short circuits in the device.

Embodiments may provide a first device. The first device may comprise a substrate, a plurality of conductive bus lines disposed over the substrate, and a plurality of OLED circuit elements disposed on the substrate, where each of the OLED circuit elements comprises one and only one pixel electrically connected in series with a fuse. Each pixel may further comprise a first electrode, a second electrode, and an organic electroluminescent (EL) material disposed between the first and the second electrodes. The fuse of each of the plurality of OLED circuit elements may electrically connect each of the OLED circuit elements to at least one of the plurality of bus lines. Each of the plurality of bus lines may be electrically connected to a plurality of OLED circuit elements that are commonly addressable and at least two of the bus lines may be separately addressable.

In some embodiments, in the first device as described above, each of the OLED circuit elements that are connected to the same bus line may be electrically connected in parallel.

In some embodiments, in the first device as described above, the organic EL material of each of the OLED circuit elements that are connected to the same bus line may each have an emission spectrum having a peak wavelength that is within 5% of one another.

In some embodiments, in the first device as described above, the plurality of bus lines may comprise at least a first bus line and a second bus line, where the first bus line may be electrically connected to a first group of OLED circuit elements each comprising an organic EL material having an emission spectrum that has a first peak wavelength and the second bus line may be electrically connected to a second group of OLED circuit elements each comprising an organic EL material having an emission spectrum that has a second peak wavelength, where the first peak wavelength and the second peak wavelength are different.

In some embodiments, in the first device as described above where the first bus line may be electrically connected to a first group of OLED circuit elements each comprising an organic EL material having an emission spectrum that has a first peak wavelength and the second bus line may be electrically connected to a second group of OLED circuit elements each comprising an organic EL material having an emission spectrum that has a second peak wavelength, the first peak wavelength may be between 400 and 500 nm and the second peak wavelength may be between 560 and 590 nm.

In some embodiments, in the first device as described above where the first bus line may be electrically connected to a first group of OLED circuit elements each comprising an organic EL material having an emission spectrum that has a first peak wavelength and the second bus line may be electrically connected to a second group of OLED circuit elements each comprising an organic EL material having an emission spectrum that has a second peak wavelength, the fuse of each of the OLED circuit elements in the first group of OLED circuit elements may each have a first melting current and the fuse of each of the OLED circuit elements in the second group of OLED circuit elements may each have a second melting current, and where the first and the second melting currents are within 5% of one another. In some embodiments, the first melting current and the second melting current may be between 0.1 mA and 50 mA. In some embodiments, the first melting current and the second melting current may be between 1 mA and 50 mA.

In some embodiments, in the first device as described above where the first bus line may be electrically connected to a first group of OLED circuit elements each comprising an organic EL material having an emission spectrum that has a first peak wavelength and the second bus line may be electrically connected to a second group of OLED circuit elements each comprising an organic EL material having an emission spectrum that has a second peak wavelength, and where the fuse of each of the OLED circuit elements in the first group of OLED circuit elements has a first melting current and the fuse of each of the OLED circuit elements in the second group of OLED circuit elements has a second melting current, the first and the second melting currents may have a difference of greater than 5%. In some embodiments, the first melting current and the second melting current may be at least 10% different. In some embodiments, the first melting current and the second melting current may be at least 30% different. In some embodiments, the first melting current and the second melting current may be at least 50% different. In some embodiments, the first melting current may be between 0.1 mA and 60 mA; and the second melting current may be between 0.1 mA and 50 mA. In some embodiments, the first melting current may be between 1 mA and 60 mA; and the second melting current may be between 1 mA and 50 mA.

In some embodiments, in the first device as described above, the plurality of bus lines may comprise at least a first bus line, a second bus line, and a third bus line. The first bus line may be electrically connected to a first group of OLED circuit elements comprising an organic EL material having an emission spectrum that has a first peak wavelength, the second bus line may be electrically connected to a second group of OLED circuit elements comprising an organic EL material having an emission spectrum that has a second peak wavelength, and the third bus line may be electrically connected to a third group of OLED circuit elements comprising an organic EL material having an emission spectrum that has a third peak wavelength.

In some embodiments, where the first device as described above comprises a first bus line electrically connected to a first group of OLED circuit elements, a second bus line electrically connected to a second group of OLED circuit elements, and a third bus line electrically connected to a third group of OLED circuit elements, the first peak wavelength of the emission spectrum of the EL material of the first group of OLED circuit elements may be between 400 and 500 nm, the second peak wavelength of the emission spectrum of the EL material of the second group of OLED circuit elements may be between 500 and 580 nm, and the third peak wavelength of the emission spectrum of the EL material of the third group of OLED circuit elements may be between 580 and 700 nm.

In some embodiments, where the first device as described above comprises a first bus line electrically connected to a first group of OLED circuit elements, a second bus line electrically connected to a second group of OLED circuit elements, and a third bus line electrically connected to a third group of OLED circuit elements, the fuse of each of the OLED circuit elements in the first group of OLED circuit elements may have a first melting current, the fuse of each of the OLED circuit elements in the second group of OLED circuit elements may have a second melting current, and the fuse of each of the OLED circuit elements in the third group of OLED circuit elements may have a third melting current. In some embodiments, the first, the second, and the third melting currents may be within 5% of one another. In some embodiments, the first melting current, the second melting current, and the third melting current may be between 0.1 mA and 50 mA. In some embodiments, the first melting current, the second melting current, and the third melting current may be between 1 mA and 50 mA.

In some embodiments, where the first device as described above comprises a first bus line electrically connected to a first group of OLED circuit elements, a second bus line electrically connected to a second group of OLED circuit elements, and a third bus line electrically connected to a third group of OLED circuit elements, and where the fuse of each of the OLED circuit elements in the first group of OLED circuit elements has a first melting current, the fuse of each of the OLED circuit elements in the second group of OLED circuit elements has a second melting current, and the fuse of each of the OLED circuit elements in the third group of OLED circuit elements has a third melting current, the first, the second, and the third melting currents may have a difference that is greater than 5%. In some embodiments, the first melting current, the second melting, and the third melting current may be at least 30% different. In some embodiments, the first melting current and the second melting current may be at least 10% different, the first melting current and the third melting current may be at least 10% different, and the second melting current and the third melting current are at least 10% different.

In some embodiments, where the first device as described above comprises a first bus line electrically connected to a first group of OLED circuit elements, a second bus line electrically connected to a second group of OLED circuit elements, and a third bus line electrically connected to a third group of OLED circuit elements, and where the fuse of each of the OLED circuit elements in the first group of OLED circuit elements has a first melting current, the fuse of each of the OLED circuit elements in the second group of OLED circuit elements has a second melting current, and the fuse of each of the OLED circuit elements in the third group of OLED circuit elements has a third melting current, the first melting current may be between 0.1 mA and 60 mA, the second melting current may be between 0.1 mA and 50 mA, and the third melting current is between 0.1 mA and 100 mA. In some embodiments, the first melting current may be between 1 mA and 60 mA, the second melting current may be between 1 mA and 50 mA, and the third melting current is between 1 mA and 100 mA.

In some embodiments, where the first device as described above comprises a first bus line electrically connected to a first group of OLED circuit elements, a second bus line electrically connected to a second group of OLED circuit elements, and a third bus line electrically connected to a third group of OLED circuit elements, the first device may further comprise a fourth bus line. The first bus line may be electrically connected to a first group of OLED circuit elements comprising an organic EL material having an emission spectrum that has a first peak wavelength, the second bus line may be electrically connected to a second group of OLED circuit elements comprising an organic EL material having an emission spectrum that has a second peak wavelength, the third bus line may be electrically connected to a third group of OLED circuit elements comprising an organic EL material having an emission spectrum that has a third peak wavelength, and the fourth bus line may be electrically connected to a fourth group of OLED circuit elements comprising an organic EL material having an emission spectrum that has a fourth peak wavelength. In some embodiments, the first peak wavelength is between 400 and 470 nm, the second peak wavelength is between 500 and 580 nm, the third peak wavelength is between 580 and 700 nm, and the fourth peak wavelength is between 470 and 500 nm.

In some embodiments, in the first device as described above, the first device may be color tunable and/or dimmable.

In some embodiments, in the first device as described above, the plurality of bus lines may comprise at least a first bus line and a second bus line, where the first bus line may be electrically connected to a first group of OLED circuit elements comprising an organic EL material having an emission spectrum that has a first peak wavelength and the second bus line may be electrically connected to a second group of OLED circuit elements comprising an organic EL material having an emission spectrum that has a second peak wavelength, and where the first peak wavelength and the second peak wavelength may be different, the first device may be configured to drive each of the plurality of OLED circuit elements at a plurality of luminance levels, where the plurality of luminance levels comprises a minimum luminance level and a maximum luminance level.

In some embodiments, the maximum luminance level may be at least two times greater than the minimum luminance level. In some embodiments, the maximum luminance level may be at least five times greater than the minimum luminance level. In some embodiments, the maximum luminance level may be at least ten times greater than the minimum luminance level.

In some embodiments, in the first device as described above that comprises a first bus line electrically connected to a first group of OLED circuit elements comprising an organic EL material having an emission spectrum that has a first peak wavelength and a second bus line electrically connected to a second group of OLED circuit elements comprising an organic EL material having an emission spectrum that has a second peak wavelength, where the first device may be configured to drive each of the plurality of OLED circuit elements at a plurality of luminance levels, the first group of OLED circuit elements and the second group of OLED circuit elements may comprise the same number of OLED circuit elements. In some embodiments, the first group of OLED circuit elements and the second group of OLED circuit elements may comprise a different number of OLED circuit elements.

In some embodiments, in the first device as described above that comprises a first bus line electrically connected to a first group of OLED circuit elements comprising an organic EL material having an emission spectrum that has a first peak wavelength and a second bus line electrically connected to a second group of OLED circuit elements comprising an organic EL material having an emission spectrum that has a second peak wavelength, where the first device may be configured to drive each of the plurality of OLED circuit elements at a plurality of luminance levels including a maximum and a minimum level, the maximum luminance level may be at least N times greater than the minimum luminance level, where the first group of OLED circuit elements and the second group of OLED circuit elements each comprise at least N OLED circuit elements. In some embodiments, the first group of OLED circuit elements and the second group of OLED circuit elements may each comprise at least 2*N OLED circuit elements.

In some embodiments, in the first device as described above that comprises a first bus line electrically connected to a first group of OLED circuit elements each comprising an organic EL material having an emission spectrum that has a first peak wavelength and a second bus line electrically connected to a second group of OLED circuit elements each comprising an organic EL material having an emission spectrum that has a second peak wavelength, where the first device may be configured to drive each of the plurality of OLED circuit elements at a plurality of luminance levels including a maximum and a minimum level, the maximum luminance level may be at least two times greater than the minimum luminance level and the first group of OLED circuit elements and the second group of OLED circuit elements may each comprise at least 2 OLED circuit elements. In some embodiments, the maximum luminance level may be at least five times greater than the minimum luminance level and the first group of OLED circuit elements and the second group of OLED circuit elements may each comprise at least 5 OLED circuit elements. In some embodiments, the maximum luminance level is at least 10 times greater than the minimum luminance level and the first group of OLED circuit elements and the second group of OLED circuit elements may each comprise at least 10 OLED circuit elements.

In some embodiments, in the first device as described above, each of the plurality of bus lines may be electrically connected to at least 20 OLED circuit elements. In some embodiments, each of the plurality of bus lines may be electrically connected to at least 50 OLED circuit elements. In some embodiments, each of the plurality of bus lines may be electrically connected to at least 100 OLED circuit elements.

In some embodiments, in the first device as described above, the plurality of bus lines may comprise a first group of commonly addressable bus lines and a second group of commonly addressable bus lines, where each of the bus lines of the first group of commonly addressable bus lines may be electrically connected to a first group of OLED circuit elements each comprising an organic EL material having an emission spectrum that has a first peak wavelength and each of the bus lines of the second group of commonly addressable bus lines is electrically connected to a second group of OLED circuit elements that each comprise an organic EL material having an emission spectrum that has a second peak wavelength. The first peak wavelength and the second peak wavelength may be different. In some embodiments, the first group of commonly addressable bus lines and the second group of commonly addressable bus lines may be separately addressable. In some embodiments, the bus lines that comprise the first group of commonly addressable bus lines may be electrically connected in parallel and the bus lines that comprise the second group of commonly addressable bus lines may be electrically connected in parallel.

In some embodiments, in the first device as described above, the first electrode of each of the plurality of OLED circuit elements may be patterned. In some embodiments, the first electrode of each of the plurality of OLED circuit elements may be electrically connected to one of the plurality of bus lines through the fuse.

In some embodiments, in the first device as described above where the first electrode of each of the plurality of OLED circuit elements is patterned and is electrically connected to one of the plurality of bus lines through the fuse, the first electrode and the fuse of each of the plurality of OLED circuit elements may be fabricated simultaneously. In some embodiments, the first electrode and the fuse of each of the plurality of OLED circuit elements may comprise substantially the same material. In some embodiments, the first electrode and the fuse of each of the plurality of OLED circuit elements may comprise the same material. In some embodiments, the first electrode and the fuse of each of the plurality of OLED circuit elements may be integrally coupled.

In some embodiments, in the first device as described above where the first electrode of each of the plurality of OLED circuit elements is patterned and is electrically connected to one of the plurality of bus lines through the fuse, the fuse of each of the OLED circuit elements and the bus line that it is electrically connected to may comprise substantially the same material. In some embodiments, the fuse of each of the OLED circuit elements and the bus line that it is electrically connected to may comprise the same material. In some embodiments, the fuse of each of the OLED circuit elements and the bus line that it is electrically connected to may be integrally coupled.

In some embodiments, each of the fuses of the OLED circuit elements may comprise a transparent conductive oxide (TCO).

In some embodiments, the first device further comprises a color mixing mechanism.

BRIEF DESCRIPTION OF THE DRAWINGS

FIG. 5(a) illustrates the power loss associated with a design of a stripe emitter that is electrically connected to a fuse. FIG. 5(b) illustrates the power loss associated with a plurality of exemplary pixels that are each electrically connected to a bus line by a fuse in accordance with some embodiments.

DETAILED DESCRIPTION OF THE INVENTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
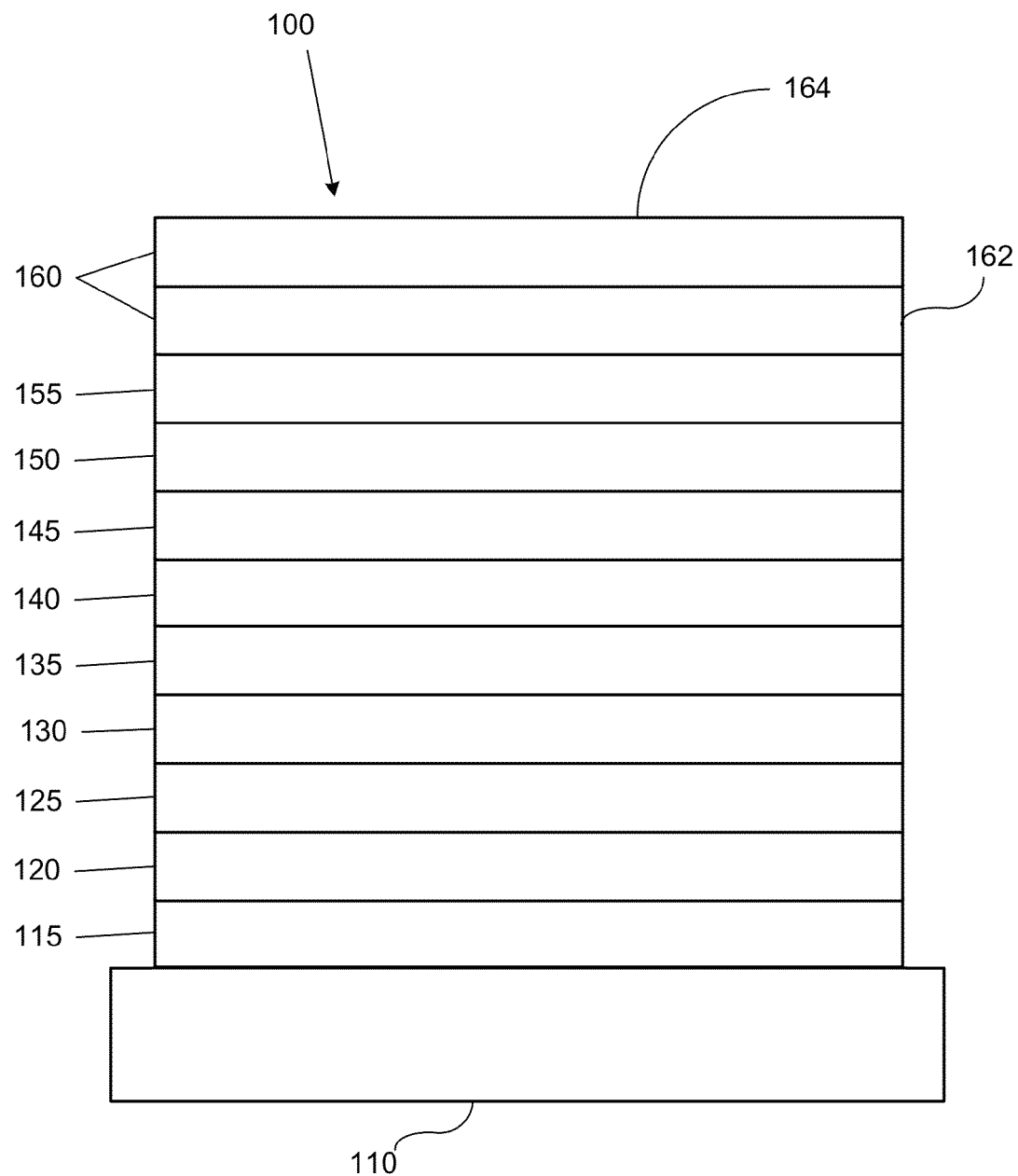
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
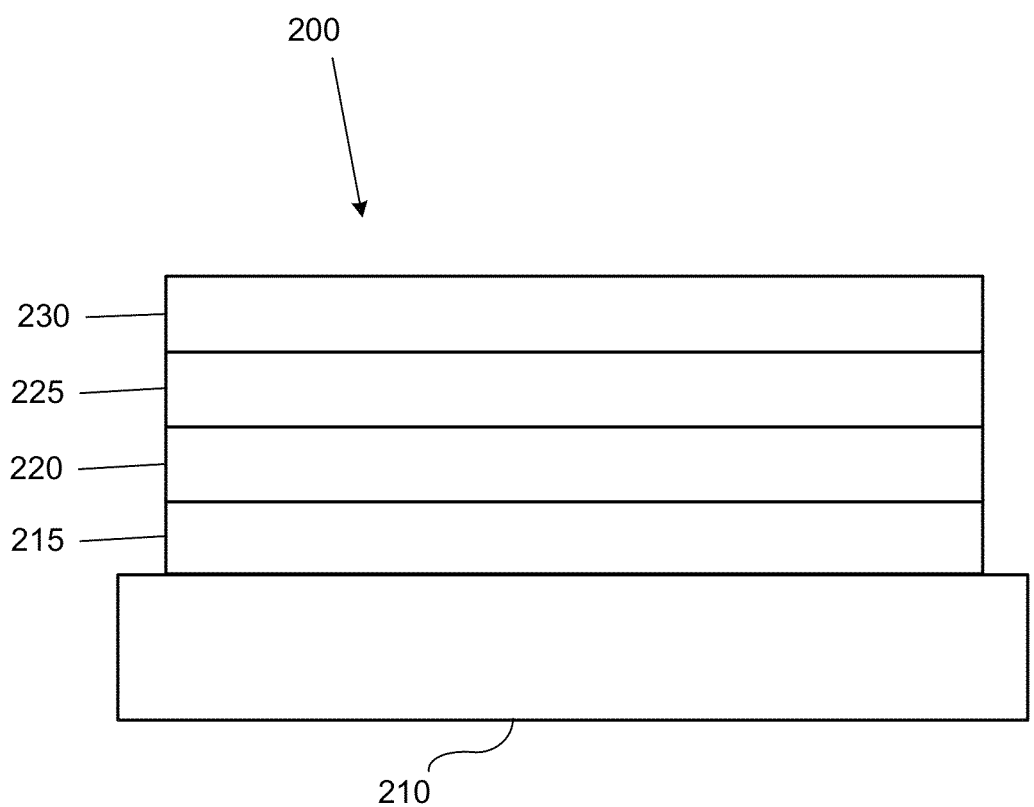
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, lighting fixtures, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Some additional terms that may be used herein may be defined or described as follows:

As used herein, the term "blanket layer" may refer to a layer that is common to all of, or substantially all of, the OLEDs on a substrate. A blanket layer may be deposited through a mask that prevents material from depositing around the edges of the substrate (for example, in the area required for encapsulation or in areas requiring electrical contact from an external power supply or video signal). However, the deposition of a blanket layer generally does not involve deposition of materials onto the substrate through a mask that defines features on the substrate (such as individual pixels of one particular color), such as a Fine Metal Mask (FMM). In general, the mask used for blanket deposition does not need to be aligned to a degree of precision that exactly matches the deposition holes with sub-pixel size features on the substrate.

As used herein, the term "commonly addressable" may refer to configurations in which the current in one device (or group of devices) cannot be changed without changing the current in another device (or group of devices). The current and/or current density supplied to each device or group of devices need not be the same. This may be the case, for instance, when a voltage is applied across a plurality of bus lines or devices (or groups of bus lines or devices) that have a different resistance (or for OLEDs, a different emissive area), when a resistor is electrically connected in series or in parallel with a bus line, device, or group of devices that is different from a resistor electrically connected in series or parallel with another bus line, device or group of devices, or any other manner of establishing different currents and/or current densities to bus lines or components within a device. However, once the current is established for one bus line, device or group of devices, this also sets the current for the bus line, device, or other groups that are commonly addressed. That is, "commonly addressable" may refer to configurations in which there is essentially a single switch that controls whether current flows through the bus lines or devices (i.e. whether the devices are driven by a current—in other words, whether the devices are "on" or "off"). The bus lines, devices, or groups of devices may not thereby be individually activated and/or deactivated. In this regard, OLEDs that are commonly addressable may also be dimmed (e.g. by reducing the current supplied to the device or portions thereof), but in such a case, each of the OLEDs are dimmed together. That is, if one OLED is dimmed, each of the other OLEDs is also dimmed, though not necessarily by the same proportion. This may be in contrast to bus lines, devices, or groups of devices that are individually addressable.

As used herein, the term "comprising" is not intended to be limiting, but may be a transitional term synonymous with "including," "containing," or "characterized by." The term "comprising" may thereby be inclusive or open-ended and does not exclude additional, unrecited elements or method steps when used in a claim or describing embodiments. For instance, in describing a method, "comprising" indicates that the claim is open-ended and allows for additional steps. In describing a device, "comprising" may mean that a named element(s) may be essential for an embodiment, but other elements may be added and still form a construct within the scope of a claim. In contrast, the transitional phrase "consisting of" excludes any element, step, or ingredient not specified in a claim or when describing an embodiment. This is consistent with the use of the term throughout the specification.

As used herein, the "cross-sectional area" of a fuse may refer to the area of a cross section of the fuse that is substantially perpendicular to the direction of current flow through the fuse.

As used herein, an "excess current" may refer to an amount of current that is greater than the maximum current flowing through a fuse during normal operation, such as the amount of current that occurs in response to a short circuit and/or a reverse current of any magnitude.

As used herein, a "fuse" may refer to a component that is electrically conductive under normal operation, but when an excess current flows through the fuse, the fuse is configured to open an electrical circuit. A fuse may open an electrical connection or circuit in any suitable manner. For example, a fuse may burn or may otherwise open an electrical circuit in response to excess current such as by melting, ablating, cracking, or undergoing any other chemical or physical change that prevents the flow of current through the fuse. Thus, as may be appreciated by one of skill in the art, there are many possible mechanisms by which a fuse may open an electrical connection in accordance with embodiments disclosed herein. Excess current could be caused by, for example, a current surge from the mains or by the application of excess current from the source. In some instances, excess current could arise from the application of reverse current to the device or could arise upon the occurrence of a short circuit. The above are provided as examples and are not intended to be limiting. In general, there may be various causes of electrical shorts. These include, but are not limited to, locally high electric fields caused by variations in the thickness of the organic stack, conductive spikes on the TCO surface, and/or pinholes in the cathode layer or particulate contamination inside the organic stack, on the electrode surfaces, or arising from conductive bus lines. Electrical shorts may also arise, for instance, because of incomplete coverage of an insulating layer (such as a grid layer), such that there is a local low resistance path between the electrodes. Thus, as used in this context, a fuse may open an electrical connection in response to excess current that may arise from some or all of these causes, or any other cause.

As used herein, the "melting current" of a fuse may refer to the minimum current at which the fuse is designed to open, and is preferably less than the short circuit current but greater than the maximum operating current. A person of ordinary skill in the art would know how to select parameters of the fuse to accommodate desired or designed maximum operating current, minimum short circuit current, and melting current. Although the current at which the fuse opens an electrical connection may be referred to herein as the "melting current," it should be understood that there are many possible mechanisms by which a fuse may open an electrical connection other than melting or ablating the fuse. Some examples of such mechanisms were provided above. Therefore, as would be understood by one of ordinary skill in the art, the "melting current" for a fuse may generally refer to the current at which the fuse opens an electrical connection, regardless of the manner in which this is achieved.

As used herein, a "light fixture" may comprise any one of, or some combination of any of the following: a light source or lamp; a reflector; an aperture; a lens; a power supply; a connection to a power source; and/or a light socket to hold the lamp.

As used herein, a "short circuit current" may refer to the current that flows through a device when a short circuit occurs in the absence of a fuse.

Embodiments provided herein may comprise devices, and/or methods of manufacturing devices, that comprise a plurality of OLED pixels that are electrically connected to one or more fuses and that are integrated into the device so as to protect the device and/or components of the device from electrical shorts and other failures. The device may for example comprise a plurality of bus lines and a plurality of individual OLED lighting pixels that may each be connected to one of the bus lines by one or more fuses. Each of the pixels connected to a bus line may be commonly addressable and at least two of the plurality of bus lines may be separately addressable (i.e. "individually addressable"). The separately addressable bus lines may thereby provide embodiments with the capability of being color tunable (e.g. the proportion of each color emitted from a device having red (r), green (g), and blue (b) OLED stripes or pixels may be adjusted) and/or dimmable, while also comprising fuses to protect the device and/or reduce the effect of short circuits or other causes of excessive current. As described in more detail below, embodiments may provide some additional advantages as well, such as (1) a reduction in the loss of emissive area of the device when a fuse opens in response to excess current and thereby electrically isolates a portion of the emissive area, (2) greater design tolerance in designing the fuse such that it does not open an electrical circuit under normal operating conditions, but may still open when a relatively low excess current occurs when the device (or the OLED pixels of the device) are operating at relatively low luminance level (i.e. at low operating current); and (3) the device may have reduced resistive power loss through the fuses than other designs. It should be appreciated that not all embodiments provide each of the advantages noted above.

As noted above, embodiments may provide an OLED light panel design in which fuses are integrated into the panel to protect the panel from electrical shorts (or to reduce the effect of a short on the performance and appearance of the panel). In some of the embodiments provided herein, relatively small individual OLED pixels may be connected to bus lines by one or more fuses. As described in more detail below, this may provide improved device performance and other advantages over designs in which, for instance, fuses are connected to relatively large lighting stripes (rather than pixels). In general, the terms "pixel" and "stripe" are well understood in the art. A "lighting stripe" or "OLED lighting stripe" may refer to an OLED that has an active area that includes a dimension that is similar to a dimension of the substrate or panel (typically within 50% of at least one of the dimensions). For example, if the active area of a device or panel has dimensions 1 cm×1 cm, then a lighting stripe may have at least one dimension of between 0.5 and 1.0 cm. In contrast, a "pixel" or "OLED pixel" typically has an active area having dimensions that are substantially smaller than the dimensions of a substrate or panel (e.g. the dimensions are less than 50% of the dimensions of the panel or substrate, and generally less than 10%). For example, if the active area of a device or panel has dimensions of 1 cm×1 cm, then a pixel will have dimensions that are substantially less the 0.5 cm (typically less than 0.1 cm).

It should be noted that the emissive area of each pixel of a device may be determined in part based on the size of the lighting panel itself. In general, the smaller the percentage of the total emissive area that the emissive area of each OLED pixel comprises, the less noticeable a non-emitting pixel (e.g. a pixel that has been electrically isolated by a fuse) will be to an observer of the device (e.g. a lighting panel or display). Therefore, in some instances it may be preferred that the emissive area of each pixel comprises less than 5% of the total emissive area of the panel, more preferable less than 1% of the total emissive area of the panel; and more preferably less than 0.1% of the total emissive area. For many common devices (e.g. lighting panels such as overhead lighting panels and desk lamps, or displays), a preferred size of the emissive area of each pixel may be between 0.01 cm$^2$ and 5.0 cm$^2$. However, embodiments are not so limited.

Figure 3:
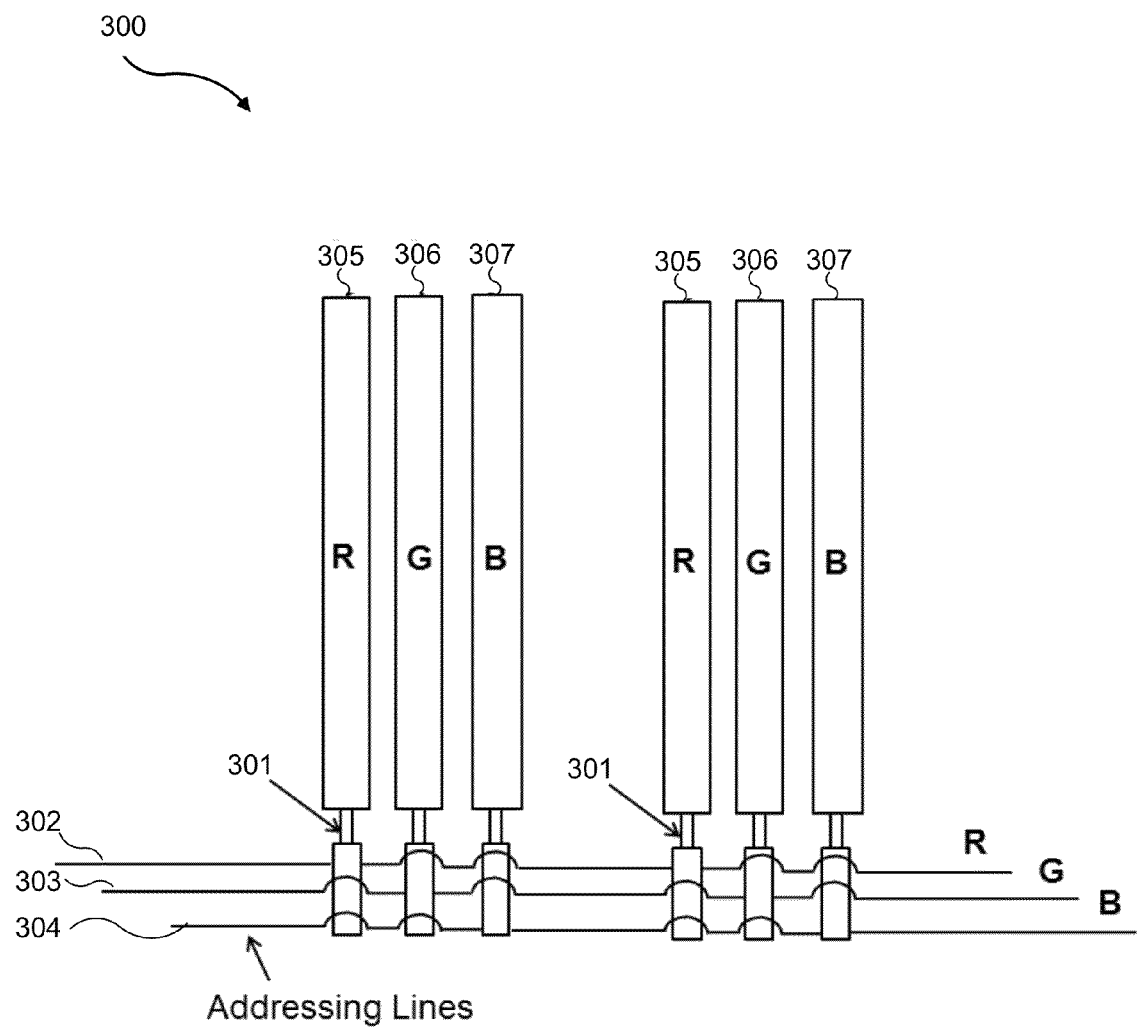
FIG. 3 shows a design of an OLED having red, green, and blue stripe emitters, where each stripe is connected to a fuse.

For illustration purposes, FIG. 3 provides an example of a design of a lighting panel 300. The panel 300 comprises a plurality of OLED lighting stripes 305, 306 and 307 corresponding to Red, Green, and Blue emitting OLEDs, respectively. Each Red OLED lighting stripe 305 is shown as being connected to an addressing line 302, each Green OLED stripe 306 is shown as being connected to an addressing line 303, and each Blue OLED stripe 307 is shown as being connected to an addressing line 304. A fuse 301 is attached to the end of each of the Red 305, Green 306, and Blue 307 OLED lighting stripes. If a short occurs in a portion of one of the OLED lighting stripes, the entire stripe will be electrically isolated by fuse 301 and thereby potentially causing a large and noticeable non-emitting area of the device 300.

Figure 4:
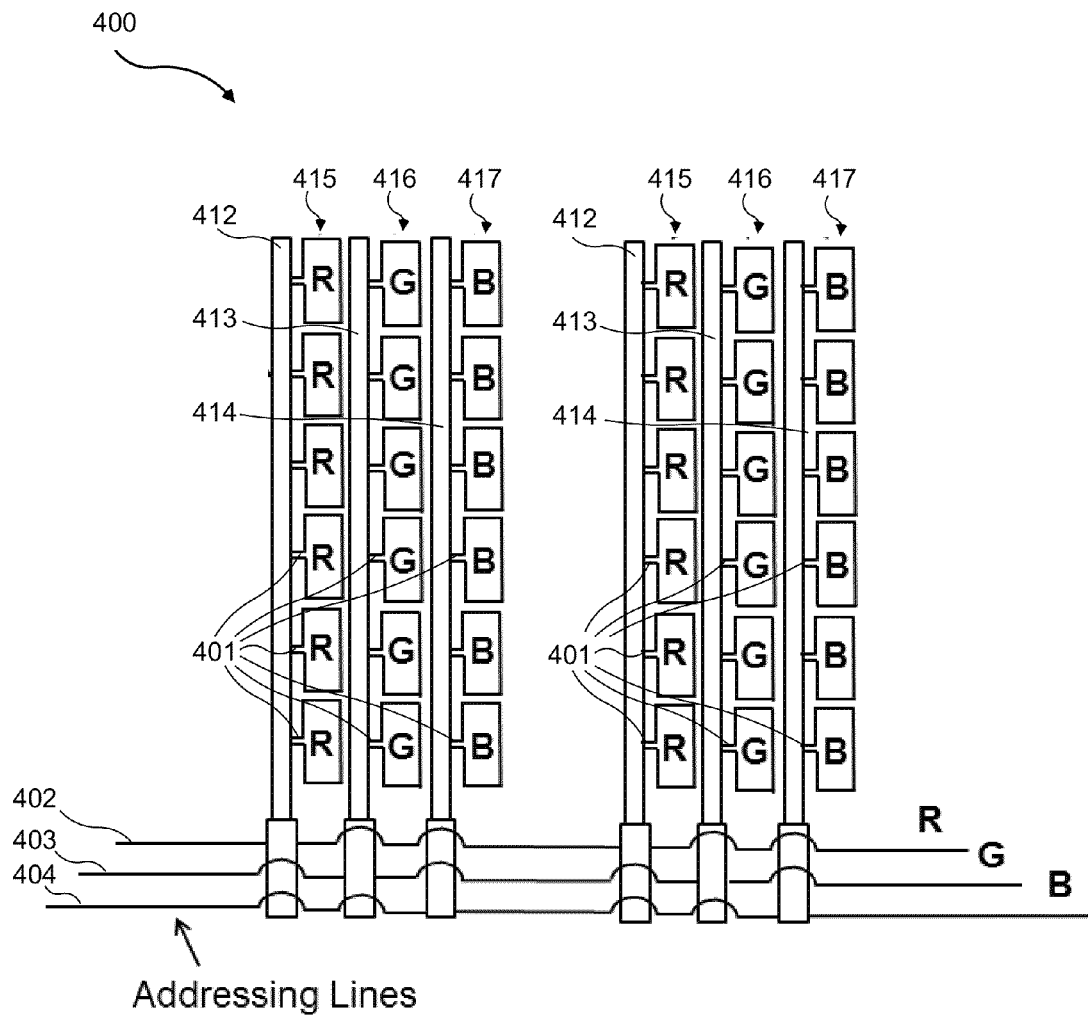
FIG. 4 shows an exemplary device comprising a plurality of red, green, and blue pixels each electrically connected to one of a plurality of bus lines by a fuse in accordance with some embodiments.

FIG. 4 shows an exemplary device 400 in accordance with some embodiments provided herein. As shown in FIG. 4, the device 400 comprises a plurality of Red 415, Green 416, and Blue 417 OLED pixels electrically connected to one of a plurality of bus lines via a fuse 401. As shown in this example, each of the Red OLED pixels 415 is electrically connected by a fuse 401 to a first bus line 412, each of the Green OLED pixels 416 is electrically connected by a fuse 401 to a second bus line 413, and each of the Blue OLED pixels 417 is electrically connected by a fuse 401 to a third bus line 414. In this example, the device 400 comprises multiple bus lines that are each electrically connected to OLED pixels having the same color. While this may be a preferred embodiment in some instances, it should be appreciated that embodiments are not so limited and a bus line could, in some applications and devices, be connected to OLED pixels that emit light of different colors.

Continuing with reference to FIG. 4, in some instances, each of the bus lines 412 connected to the Red OLED pixels 415 may be electrically connected in parallel with one another; each of the bus lines 413 connected to the Green OLED pixels 416 may be electrically connected in parallel with each other; and each of the bus lines 414 electrically connected to the Blue OLED pixels 417 may be electrically connected in parallel with each other. In some embodiments, the three sets (or "groups") of pixels (i.e. Group 1 corresponding to the Red OLED pixels 415; Group 2 corresponding to the Green OLED pixels 416; and Group 3 corresponding to the Blue OLED pixels 417) may be separately addressable. That is, each of the bus lines 412 that are shown as electrically connected to the Red OLED pixels 415 may be separately addressable (e.g. via single addressing line 402) from each of the bus lines 413 that are shown as electrically connected to the Green OLED pixels 416 (and electrically connected to addressing line 403) and each of the bus lines 414 that are shown as electrically connected to the Blue OLED pixels 417 (and electrically connected to addressing line 404). Moreover, each of the bus lines 413 that are shown as electrically connected to the Green OLED pixels 416 may be separately addressable from each of the bus lines 414 that are shown as electrically connected to the Blue OLED pixels 417. This exemplary type of bus line and pixel configuration may enable the light emissions from each of the OLED pixels of the same color to be adjusted relative to the light emissions from each of the OLED pixels having a different color (even though the OLED pixels of each color may be electrically connected to a plurality of separate bus lines), which may provide the device with the capability to color tune the light emissions and/or enable the device to be dimmed while maintaining a chromaticity of the light emitted from the device. However, embodiments are not so limited. For example, in some embodiments, each bus line may be separately addressable, even from bus lines that may be electrically connected to OLED pixels that emit light having the same (or substantially the same) color.

It should be understood that FIG. 4 is provided for illustration purposes, and that in general any suitable design, configuration, or combination of bus lines and groups of OLED pixels may be utilized in accordance with some embodiments. For example, in some instances, a device may comprise four bus lines (or four groups of bus lines) connected to OLED pixels that emit light according to four different emissive spectrums. One such configuration that the inventors have found may be particularly advantageous in some instances is to utilize two different groups of "blue" OLED pixels—a group of OLED pixels that emit light having a peak wavelength corresponding to a deep blue (e.g. between 400 nm and 470 nm) and a group of OLEDs that emit light having a peak wavelength corresponding to a light blue (e.g. between 470 nm and 500 nm). In general, OLED pixels that emit light having a deeper blue color may have reduced lifetime and performance compared to other OLED pixels (and may thereby limit device performance and lifetime). Therefore, providing both a lighter blue (that may have better lifetime than the deep blue) may reduce the operating current density of the darker blue OLED pixels while still providing the desired colors and/or white point for the device.

The exemplary device 400 shown in FIG. 4 (e.g. having fuses 401 that are electrically connected to a plurality of OLED pixels 415-417) may provide some advantages over the panel design shown in FIG. 3 (e.g. having fuses 301 that are electrically connected to OLED lighting stripes 305-307). For example, if an electrical short is present in one of the OLED lighting stripes 305-307 shown in FIG. 3, the entire OLED lighting stripe area will become non-emissive. These OLED lighting stripes typically comprise a large percentage of the emissive area of the device and therefore a short in one stripe can thereby lead to a significant loss of emissive area and total light output of the device, as well as a color shift in the total light emission away from a desired chromaticity (such as the white point of the device). That is, for example, if an entire lighting stripe of one color becomes non-emissive (e.g. because it is electrically isolated by a fuse), the chromaticity of the total light emissions of the device may be shifted based on the relatively large reduction in light emitted of a particular color. The result may be a device that will have poor aesthetics and a non-emissive area that may be clearly visible to an observer. In contrast, in the exemplary device shown in FIG. 4, when an electrical short is present in one of the OLED pixels 415-417, only a single OLED pixel will become non-emissive (i.e. the pixel will be electrically isolated by its fuse 401). The inventors have thereby found that the use of pixels with relatively small emissive areas may reduce the impact created by such shorts, particularly in comparison to device designs similar to those shown in FIG. 3.

The exemplary device shown in FIG. 4 may also offer manufacturing and design advantages for providing fuses 401 that have desired performance parameters (e.g. that have a melting current such that the fuse does not open an electrical circuit under normal operation, but the fuse does open an electrical circuit in response to excess current, even at low operating current) particularly in comparison to the design and manufacture of devices such as the example shown in FIG. 3. In general, when integrating a fuse into an OLED panel (e.g. a lighting panel or a display), the fuse is designed so that it operates under normal conditions without opening the electrical circuit. However, when an electrical short is present, the fuse is designed to open the electrical circuit as quickly as possible so as to reduce damage to the device. In a color tunable OLED panel, there is usually freedom to adjust the luminance level of the Red, Green, and Blue emissions (i.e. by adjusting the current at which the corresponding groups of OLEDs are driven). This adjustability enables color tunability of the lighting panel and may also enable the panel to be dimmed. To allow for the color to be tuned and for the panel to be dimmed, each fuse may be designed to ensure that (a) the fuse opens even at relatively low luminance when there is an electrical short, and (b) the fuse does not open even at very high luminance when the panel is operating under normal conditions. That is, the fuse may be designed such that it has a melting current ($I_M$) that: (1) is higher than the largest operating current an OLED pixel may be driven at during normal operation; and (2) is lower than the smallest current that is likely to occur if a fault develops in a corresponding OLED pixel during normal operation. In some embodiments, the smallest current that is likely to occur if a fault develops is substantially the same as the total current going through the device when it is driven at the lowest luminance level. In general, to readily achieve these design criteria, it may be preferred that there is a large difference between the current flowing though the fuse under normal operations and the current flowing through the fuse when an electrical short (or other fault) is present.

For example, if a fuse is designed to open an electrical connection (e.g. by melting, ablating, breaking, etc.) at a melting current ($I_M$), then under normal operating conditions, the current (I) flowing through the fuse should be $I<I_M$, or more preferably $I<½I_M$ so that some tolerance is built into the design (e.g. when a fuse is opened for one pixel, the operating current in each of the remaining pixels will increase slightly at each luminance levels in reverse proportion to the number of pixels). With reference to an exemplary light device that may be in analogy to a display, it may be desired to have 256 different grey levels (i.e. luminance levels) for each color on the panel. This would allow the panel to generate $256^3$=16,777,216 different total emission colors. In this case, a fuse may open when there is an electrical short when the panel is operating at the lowest of the 256 luminance levels (i.e. the "minimum luminance level"), but not open under normal operation (e.g. at the highest of the 256 luminance levels—i.e. the "maximum luminance level"). It will be assumed for purposes of illustration that the highest luminance level is 256 times greater than the lowest luminance level, and accordingly, that the highest current density $j_{max}$ to drive each stripe or pixel at the highest luminance level is 256 times greater than the lowest current density $j_{min}$ to drive each strip or pixel at the lowest luminance level—i.e. $j_{max}$=256·$j_{min}$. As noted above, the highest current of each strip or pixel under normal operating conditions (i.e. when the device is operating at the highest luminance level) should be smaller than the total lowest current of the entire device or panel (i.e. the total current of the device when operating at the lowest luminance level), the emissive area of each stripe (e.g. in FIG. 3) or pixel (e.g. in FIG. 4) of each color ($A_r$ for Red, $A_g$ for Green and $A_b$ for Blue) should be less than the total area of all the stripes or pixels of each color connected in parallel ($A_R$ for Red, $A_G$ for Green and $A_B$ for Blue), 256·$A_r$<$A_R$, 256·$A_g$<$A_G$, and 256·$A_b$<$A_B$, such that: $j_{max}·A_r$=256·$j_{min}·A_r$<$j_{min}·A_R$, $j_{max}·A_g$=256·$j_{min}·A_g$<$j_{min}·A_G$, $j_{max}·A_b$=256·$j_{min}·A_b$<$j_{min}·A_B$, or more preferably 512·$A_r$<$A_R$, 512·$A_g$<$A_G$, and 512·$A_b$<$A_B$, so as to provide some tolerance into the design, where 512 corresponds to twice the difference of luminance levels in this example.

In view of the above considerations, for the design shown in FIG. 3 where a fuse is attached to the end of a plurality of lighting stripes 305-307, this results in a determination that the device should comprise more than 256 (or more preferably more than 512) stripes of each color for the panel to display the full range of 16,777,216 emission colors, and still enable a fuse to function within the design parameters noted above. Such a design could be very difficult to manufacture from a practical standpoint, especially with smaller panel areas. For example, in a 12 cm×12 cm emissive area panel having (3×512 stripes)=1,536 stripes, each stripe (305-307) would be less than 80 microns wide. However, using the exemplary design shown in FIG. 4 comprising a plurality of individual pixels (415-417), where each pixel may be connected by a fuse 401 to a high conductivity bus line (412-414), then far fewer sets of bus lines would be required. For example, if each lighting stripe was divided into a plurality of 1.0 mm×1.0 mm OLED pixels, then there would be 120 OLED pixels attached to each bus line. In this example, only five bus lines would be required for each color to have 512 different emissive levels, which is relatively easy to achieve using standard manufacturing techniques and at low-cost without fine alignment.

In general, when integrating fuses into a panel, it is preferable that the fuses operate with minimal resistive loss under normal operating conditions. With reference to FIGS. 5(a) and 5(b), another potential advantage that some embodiments having a plurality of OLED pixels may provide in comparison to device designs such as those that comprise a plurality of lighting stripes may be that the plurality of pixels provide for a reduction in power loss.

FIG. 5(a) shows an exemplary OLED lighting stripe 505 electrically connected to a fuse 501 having resistance ($R_1$). For this device design in which there is a fuse 501 electrically connected at one end of the lighting stripe 505, the resistive loss in the fuse 501 is given by the formula $I^2R=I_1^2R_1$, where $I_1$ is the current passing through the fuse 501 and the stripe 505, and $R_1$ is the resistance of the fuse 501. For comparison, FIG. 5(b) shows a portion of an exemplary device that comprises a plurality of OLED pixels 515 that are each connected in parallel to a bus line 512 by a plurality of fuses 511. Assuming that all of the OLED pixels 515 have the same emissive area and the total emissive area of all OLED pixels 515 is the same as that of lighting strip 505, as well as that the current density in the emissive area for the lighting stripe 505 is the same as the current density in the emissive area for each of the lighting pixels 515, the current ($I_2$) flowing through each fuse 511 is given by $I_2=I_1/n$, where n is the number of OLED lighting pixels 515 connected in parallel to the bus line 512. The resistance ($R_2$) of each fuse 511 may reasonably be assumed to be the same as the resistance ($R_1$) of the fuse 501 in FIG. 5(a), such that $R_2=R_1$. This is because the current flowing through the fuse 511 when there is an electrical short in the emissive area of one of the OLEDs will be approximately the same for both of the designs in FIGS. 5(a) and (b), so that the melting current ($I_M$) of the fuse 511 may also be approximately the same as the fuse 501. The resistive loss for the design in FIG. 5(b) is then given by $I^2R=n\times(I_1/n)^2 R_1=I_1^2R_1/n$. In other words, the total resistive loss in the fuses 511 for the exemplary device comprising a plurality of OLED pixels shown in FIG. 5(b) is n times lower than for the design shown in FIG. 5(a) comprising one or more lighting stripes.

Figure 6:
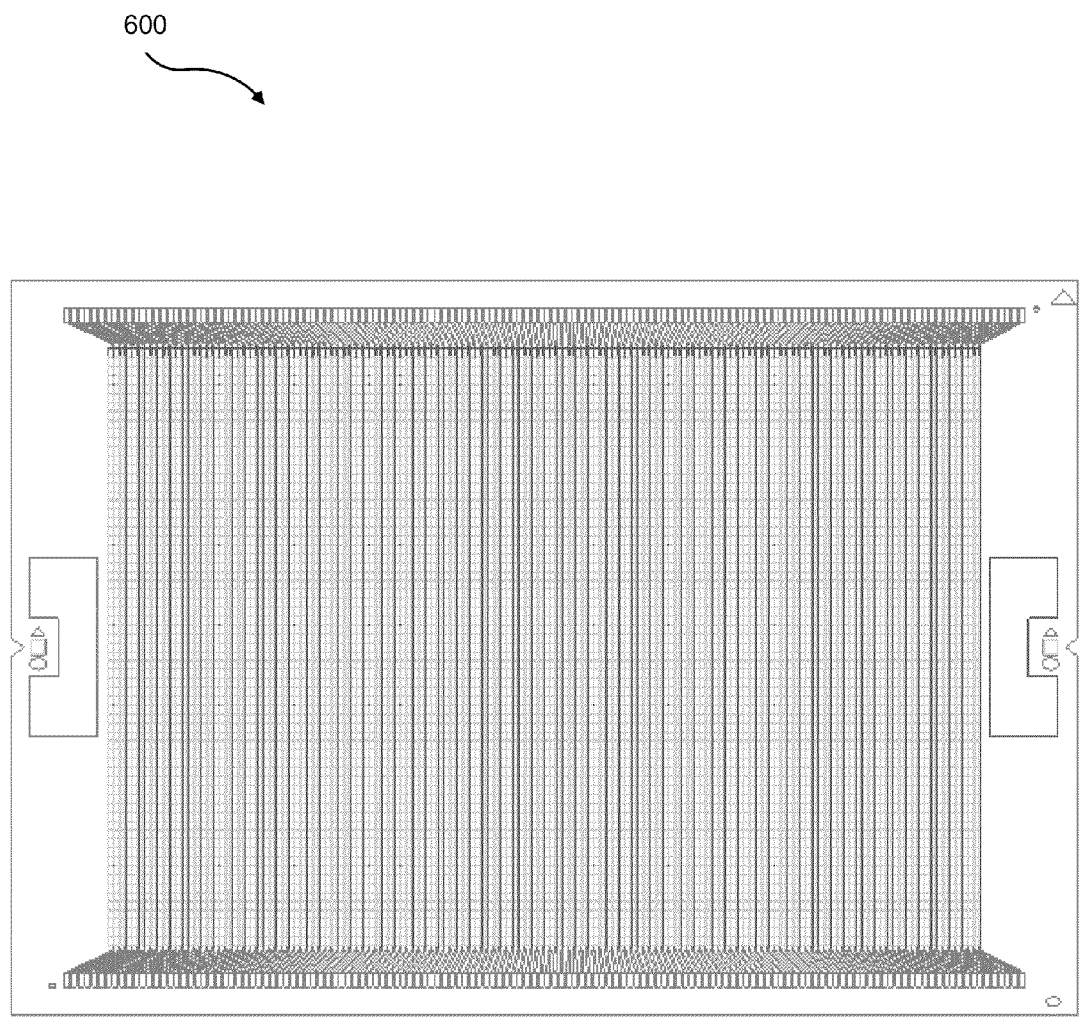
FIG. 6 shows an exemplary layout for a color tunable OLED panel in accordance with some embodiments.

FIG. 6 shows an exemplary 15 cm×15 cm color tunable OLED panel 600 designed in accordance with some embodiments provided herein. The panel 600 is targeted to display red, green, blue as well as a combination of the three colors up to 5 times luminance difference. The overall panel layout comprises 35 red (R), 35 green (G), and 70 blue (B) OLED master stripes. A "master stripe" refers to all of the devices that are connected to the same (i.e. a common) bus line; however, each master stripe may comprise a plurality of segmented pixels. Thus, a "master stripe" may comprise a bus line that is electrically connected to a plurality of OLED pixels (e.g. through a fuse). In this example embodiment, the master stripes comprising the same color OLED pixels are commonly addressable, while the master stripes comprising OLED pixels of different colors may be individually or separately addressed. The inventors have found that there is a potential advantage in some instances for doubling the number of blue master stripes (i.e. the number of bus lines having Blue OLED pixels electrically connected thereto) in comparison to the number of red and green master stripes so as to enhance the lifetime of Blue OLED pixels by driving them at relatively lower current density for the same amount of light output, thereby enhancing the overall lifetime for the panel (because the lifetime of the blue OLED pixels is typically the limiting factor for the device lifetime).

Figure 7:
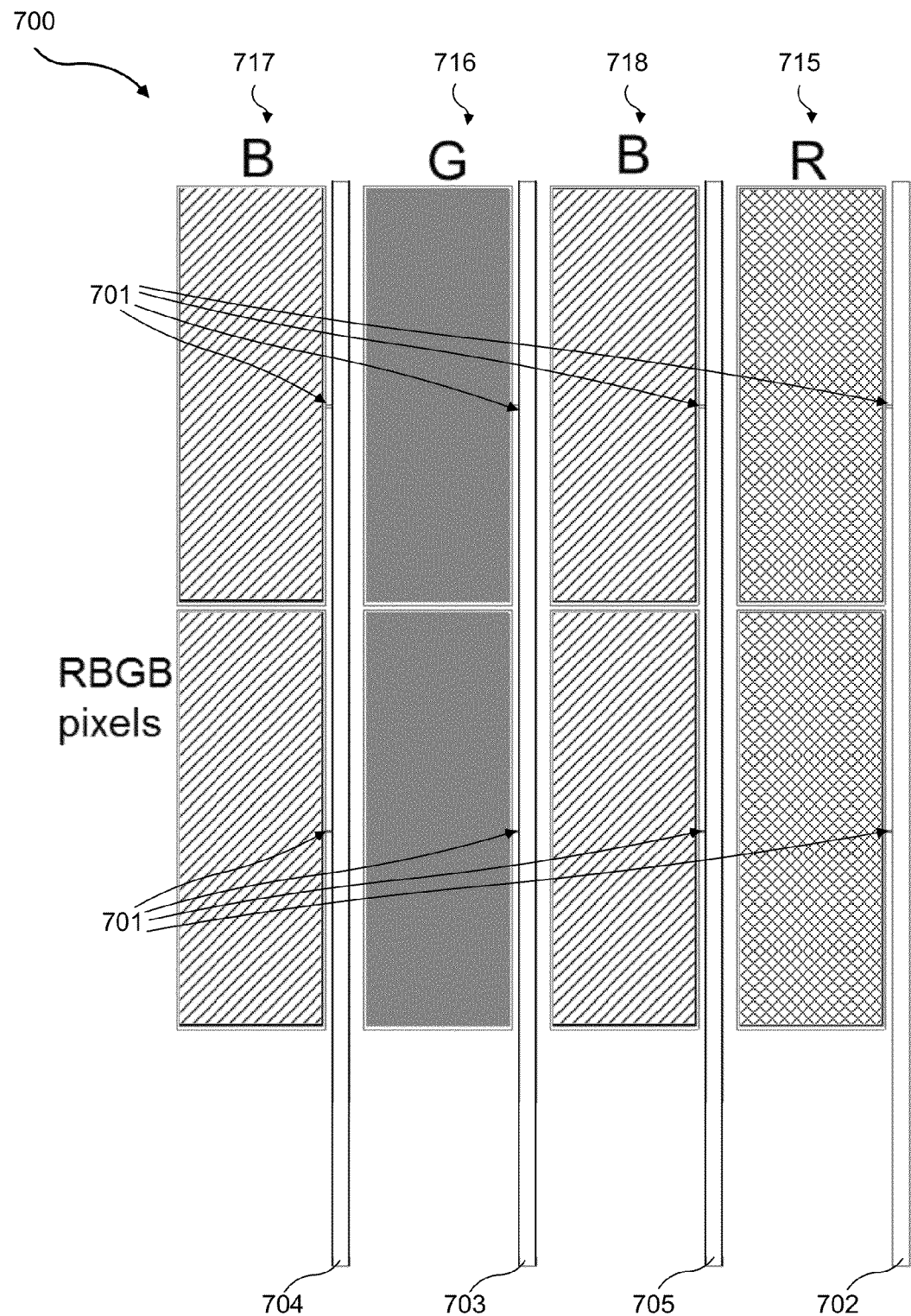
FIG. 7 shows a close-up view of a portion of an exemplary light panel that comprises red, green, and blue OLED pixels electrically connected to a bus line by a fuse in accordance with some embodiments.

FIG. 7 shows a close-up layout 700 of a portion of a set of exemplary RBGB master stripes in accordance with some embodiments. As shown, this exemplary portion of a panel comprises a first group of Blue OLED pixels 717 electrically connected via a fuse 701 to a first bus line 704 and a second group of Blue OLED pixels 718 electrically connected via a fuse 701 to a second bus line 705. The bus lines 704 and 705 may, but need not, be commonly addressable. The layout 700 of this exemplary panel also includes a group of Green OLED pixels 716 electrically connected via fuses 701 to bus line 703 and a group of Red OLED pixels 715 electrically connected via fuses 701 to bus line 702. The bus lines 702 and 703 may be separately addressable from each other and from bus lines 704 and 705. In some embodiments, the Red OLED pixels 715 may be commonly addressable, the Green OLED pixels 716 may be commonly addressable; the Blue OLED pixels 717 may be commonly addressable; and the Blue OLED pixels 718 may be commonly addressable (and may, but need not, be commonly addressable with Blue OLED pixels 717). In this example, each master stripe may further comprise 67 segmented OLED pixels, where each pixel is connected to a common bus line through a fuse 701. The pixels may each be fabricated so as to have the same dimension of 0.68 mm×1.8 mm, i.e. corresponding to an active area of 1.2 mm², regardless of the pixel emissive color. It should be understood that the exemplary dimensions and values are provided for illustration purposes only, and are not intended to be limiting. As noted above, in some instances, the groups of blue OLED pixels 717 and 718 could be further divided into OLED pixels that emit a deep blue and light blue light so that the device may provide a wider chromaticity range and also have improved device efficiency (e.g. the OLEDs 717 may comprise dark blue OLED pixels—i.e. that emit light having a peak wavelength between 400 and 470 nm—and the OLED pixels 718 may comprise light blue OLED pixels—i.e. that emit light having a peak wavelength between 470 and 500 nm). In some embodiments, the OLED pixels within each group of blue OLED pixels 717 or 718 could themselves be divided so as to include both light blue and deep blue OLED pixels. In this manner, OLED pixels that may have longer lifetimes may be utilized in combination with OLED pixels that can provide a wider range of chromaticities for the overall light emissions of the device.

Figure 8:
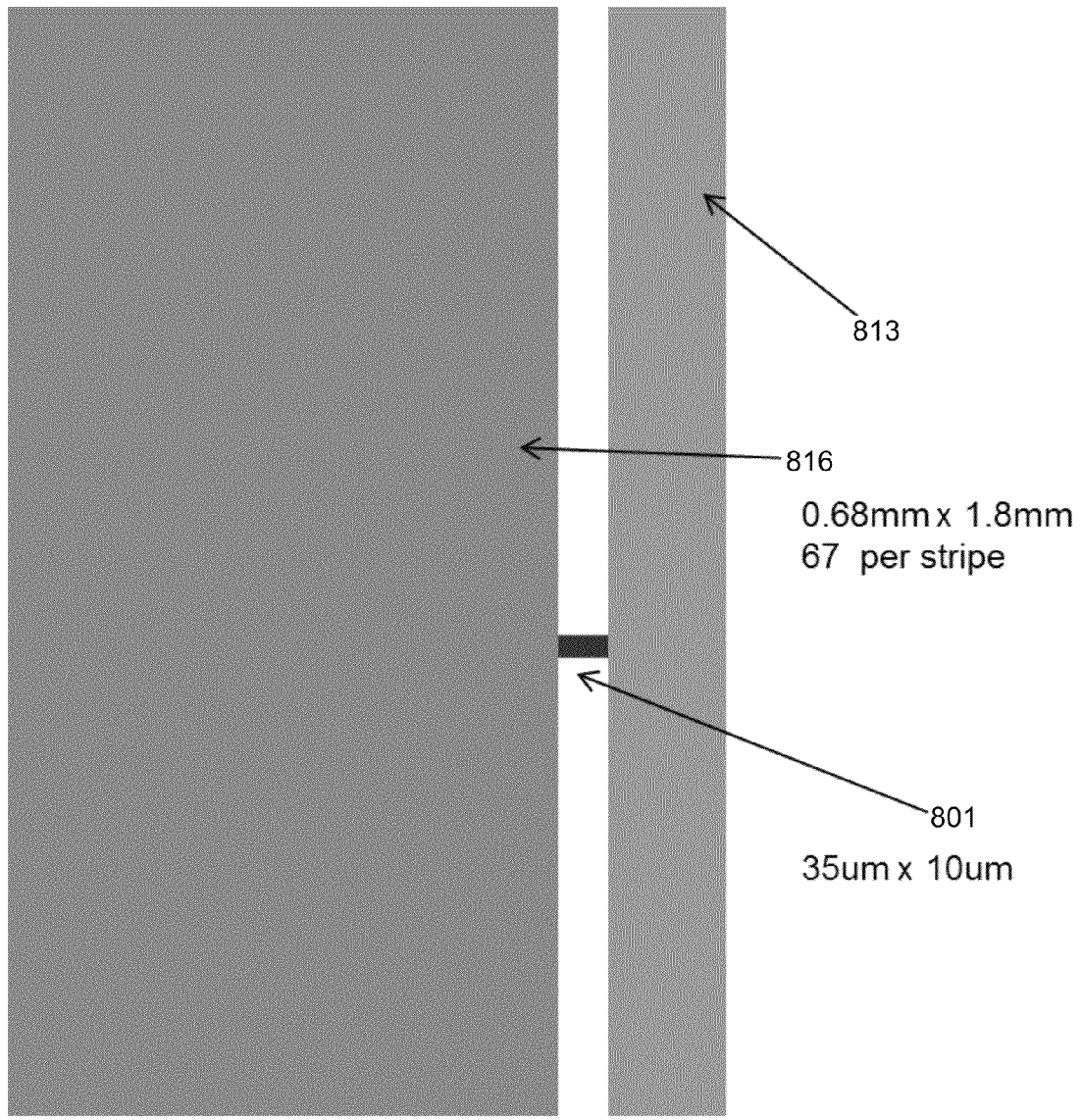
FIG. 8 shows an enlarged view of the portion of the exemplary light panel shown in FIG. 7.

FIG. 8 shows a close-up illustration of a segmented OLED pixel 816 that could correspond to the layout shown in FIG. 7, where the OLED pixel 816 has dimensions of 0.68 mm×1.8 mm. The OLED pixel 816 is shown as being electrically connected to a bus line 813 via a fuse 801 having exemplary dimensions of 35 μm×10 μm. In some embodiments, the fuse 801 may comprise the same material as an electrode of the OLED pixel 816, which may provide for a simpler and lower-cost fabrication process. For example, the electrode of the OLED pixel 816 and the fuse 801 could be manufactured simultaneously (e.g. deposited though a mask simultaneously, patterned from a base conductive layer using lithography in the same processing steps, or through any other suitable method). In some embodiments, the material for the fuse 801 and the electrode may comprise a transparent conductive oxide (TCO), such as ITO or IZO.

The inventors determined the dimensions and characteristics of the fuse in the exemplary embodiments shown in FIGS. 6-8 as described below. The values provided herein are for illustration purposes only. A person of ordinary skill in the art, after reading this disclosure, would be able to design or fabricate fuses having desired properties.

The inventors first determined targeted values for the panel to be driven from a lowest luminance level $L_{min}$=1,000 cd/m² to a highest luminance level $L_{max}$=5,000 cd/m². The current density of an OLED pixel driven at $L_{min}$ and $L_{max}$ can be extracted from the current density-luminance J-L relationship of each pixel, which may be generally known or readily determined. In this example, the inventors used a panel having a set (or group) of red, green and blue OLED pixels having known J-L performances. The methods of determining the fuse characteristics may generally be independent of the OLED device structure, and can thus be applied to any devices with known J-L relationships. In this example, the minimum ($J_{min}$) and maximum ($J_{max}$) current densities needed at 1,000 cd/m² and 5,000 cd/m² for the exemplary Red OLED pixels are 2.26 mA/cm² and 11.3 mA/cm², respectively. The minimum and maximum current densities needed at 1,000 cd/m² and 5,000 cd/m² for the exemplary Green OLED pixels are 0.46 mA/cm² and 2.0 mA/cm², respectively. The minimum and maximum current densities needed at 1,000 cd/m² and 5,000 cd/m² for the exemplary Blue OLED pixels are 0.42 mA/cm² and 3.21 mA/cm², respectively. The total combined emissive areas of the Red, Green and Blue OLED pixels are 28.7 cm², 28.7 cm² and 57.4 cm², respectively (note that there are twice as many Blue OLED pixels as Red and Green OLED pixels, which accounts for the difference in emissive areas).

Therefore, the minimum total operating currents $I_{min}$ for driving all of the Red, Green and Blue OLED pixels at 1,000 cd/m² (given by the product of the minimum current density $J_{min}$ and the total combined emissive areas of each color OLED) are 64.8 mA, 13.2 mA and 24.1 mA, respectively. The information for each color OLED pixel in this example is summarized in Table 1 below. These values represent (at least for the exemplary embodiment in which each of the bus lines that are electrically connected to OLED pixels having the same color are also commonly addressable, and bus lines that are connected to OLED pixels of a different color are separately addressable), the minimum current that is supplied to drive all of the OLED pixels of a group (in this case color) at the minimum luminance level. This would also therefore represent the short circuit current that would flow through a single OLED pixel of each color when the device (or at least the OLED pixels of a given color) is operated at the lowest luminance level. Thus, it may be preferred that the fuses for each of the OLED pixels be configured to have a melting current ($I_M$) that is below this value of $I_{min}$.

The maximum total operating currents $I_{p,max}$ for driving each of the Red, Green and Blue OLED pixels at 5,000 cd/m² (i.e. the product of the maximum current density ($J_{max}$) and the active area of each pixel) are 0.14 mA, 0.025 mA and 0.04 mA, respectively. This represents the maximum operating current that is supplied to a single OLED pixel when the device is operating normally and at the highest luminance level. Thus, it may be preferred that the fuses for each of the OLED pixels be configured to have melting current ($I_M$) that is above this value of $I_{p,max}$. This information is also summarized in Table 1 below.

|  | Red OLED Pixels | Green OLED Pixels | Blue OLED Pixels |
|---|---|---|---|
| Total Emissive Area (cm²) | 28.7 | 28.7 | 57.4 |
| $J_{min}$ (mA/cm²) | 2.26 | 0.46 | 0.42 |

-continued

|  | Red OLED Pixels | Green OLED Pixels | Blue OLED Pixels |
|---|---|---|---|
| $J_{max}$ (mA/cm$^2$) | 11.3 | 4.05 | 3.21 |
| $I_{min}$ (mA) | 64.8 | 13.2 | 24.1 |
| $I_{p,max}$ (mA) | 0.14 | 0.025 | 0.04 |

As noted above, the fuses are generally designed and configured to be able to function as a resistor for each pixel up to its maximum pixel current $I_{p,max}$ e. the maximum current that flows through each individual OLED pixel when operating normally at the highest luminance level—in this example, at 5,000 cd/m$^2$), while also being designed or configured to open the electrical circuit at currents below the minimum total current $I_{min}$ supplied to a group of OLED pixels when operated at the lowest luminance level (i.e. where the group of OLED pixels refers to OLED pixels that are connected in parallel or in any other configuration in which a short in one OLED pixel of the group causes current to be drawn from the other OLED pixels in the group).

In this exemplary embodiment described above and using the values shown in Table 1, the melting current of a fuse $I_M$, (i.e. the current at which the fuse opens an electrical circuit in response to an excess current), should be set between $I_{p,max}$ and $I_{min}$. Thus, the melting current $I_M$ should be designed or configured to be between 0.14 mA and 64.8 mA for Red OLED pixels, between 0.025 mA and 13.2 mA for Green OLED pixels, and 0.04 mA and 24.1 mA for Blue OLED pixels.

In general, the fuses may be designed to have different dimensions (or to have different characteristics such as resistivities) depending on the color of the OLED pixel they are electrically connected in series with or, in some embodiments, the fuses may be designed to have the same characteristics for all pixels regardless of color (which may occur if there is an overlap of acceptable values for the melting currents $I_M$ for the target maximum and minimum luminance levels). In the exemplary embodiment described herein, the inventors chose to use the simplified approach in which the same fuses are used for each color OLED pixel. This approach may reduce costs and manufacturing time because the fuses may be fabricated simultaneously.

It should be noted that $I_M$ is preferred to be set at a value that is higher than $I_{p,max}$ to leave some tolerance for minor current fluctuations or to account for one or more OLED pixels being electrically isolated. That is, for example, when driven at constant current, the total current supplied to the device will be distributed among a smaller number of normal operating pixels when a shorted pixel(s) is isolated from the normally operating pixels because of an open fuse, and therefore the current flowing through each remaining pixel and its related fuse will increase (the magnitude of the increase will be relative to the total number of pixels). For instance, if the panel is designed to tolerate 10% loss of total pixels, the melting current of the fuse should be set at least 10% higher than the value of $I_{p,max}$. In this particular example, the inventors chose to set $I_M$=10 mA for each color OLED pixel.

From the inventor's experimental data, it was determined that an ITO fuse with a length (i.e. the dimension of the fuse in the current flowing direction within the plane of the ITO film) of 35 μm, width (i.e. the dimension of the fuse perpendicular to the current flowing direction within the plane of the ITO film) of 10 μm, and a thickness (i.e. the dimension of the fuse perpendicular to the plane of ITO film) of 800 Å, as depicted in FIG. 8, will open an electrical circuit at approximately 10 mA. The resistance of the fuse at normal operation condition is about 270 ohm. The maximum pixel current on the panel is 0.14 mA for red OLED driving at 5,000 cd/m$^2$, and therefore the maximum voltage drop due to the fuse $\Delta V$=0.14×270 mV=0.04V, and the maximum power loss $\Delta P \approx 0.0005\%$. This amount of loss for an OLED pixel can be neglected in most applications. Thus, as was noted above, the inventors have found that some embodiments provided herein may also have the advantage of reduced power loss that is the result of using a fuse in such devices.

It should understood again that a person of ordinary skill in the art after reading this disclosure would generally be able to select the parameters of a fuse (such as material and dimensions) such that the fuse has a desired melting current. However, a more detailed discussion of fuses is provided below.

Exemplary Embodiments

Described below are exemplary embodiments of devices (such as panels including displays or lighting panels) that may comprise a plurality of separately addressable bus lines, in which each bus line may be electrically connected to one or more OLED pixels via one or more fuses. The embodiments described herein are for illustration purposes only and are not thereby intended to be limiting. After reading this disclosure, it may be apparent to a person of ordinary skill in the art that various components and/or features as described below may be combined or omitted in certain embodiments, while still practicing the principles described herein.

Embodiments may provide a first device. The first device may comprise a substrate, a plurality of conductive bus lines disposed over the substrate, and a plurality of OLED circuit elements disposed on the substrate, where each of the OLED circuit elements comprises one and only one pixel electrically connected in series with a fuse. Each pixel may further comprise a first electrode, a second electrode, and an organic electroluminescent (EL) material disposed between the first and the second electrodes. The fuse of each of the plurality of OLED circuit elements may electrically connect each of the OLED circuit elements to at least one of the plurality of bus lines. Each of the plurality of bus lines may be electrically connected to a plurality of OLED circuit elements that are commonly addressable, and at least two of the bus lines may be separately addressable. An example of such a device is shown in FIG. 4 and was described in detail above.

It should be noted that in some instances, one or more of the bus lines could be electrically connected such that they are commonly addressable, so long as at least two bus lines on the device (or two groups of bus lines) may be separately addressed. Thus, for instance, a first group of bus lines that may, for example, each be electrically connected to Red OLED pixels may be commonly addressable, but this first group of bus lines may be separately addressable from a second group of bus lines that comprises one or more bus lines that are electrically connected to, for example, Blue OLED pixels (these bus lines may also be commonly addressable or could be separately addressable). In this manner, devices may provide for two separate groups of OLEDs that may be separately controlled, while also providing protection and/or tolerance to short circuits (e.g. via the fuses connected in series with pixels).

Moreover, the language provide above is not necessarily intended to require that all of the OLED circuit elements that may be disposed on the device are connected to one of the plurality of separately addressable bus lines. That is, some embodiments may include one or more OLED circuit elements that may not be electrically coupled to one of the bus lines (such as a device that comprises an indicator light).

By utilizing a pixilated OLED design having a fuse connecting each pixel to a bus line rather than, for instance, a lighting stripe design having a fuse connected at the end of each stripe, embodiments may provide some advantages. In some instances, embodiments may reduce the effect that a short circuit (or other fault causing excess current) may have on the appearance or performance of a device because the emissive area of each pixel may be less than the emissive area of a corresponding stripe. Thus, if a short occurs in a pixel and a fuse opens the circuit, a smaller proportion of the emissive area of the device will be electrically isolated (i.e. become non-emissive). In some instances, such as when the device may comprise a display, embodiments comprising a plurality of pixels may provide for a device that may enable a broader range of luminance levels (thereby enabling the device to emit over a larger range of emission spectra) without necessarily requiring a larger device or relatively high manufacturing costs and/or complexity. This may be due in part to the fact that the use of a plurality of pixels may provide a more compact and efficient manner of providing a larger number of emissive areas over which additional current may be divided in the event that a pixel is isolated. In addition, the use of a plurality of pixels may reduce power loses associated with resistive loses that result from current flowing through each of the fuses, as described above.

As used in this context, each of the "OLED circuit elements" includes one, and only one, pixel (also referred to as an "OLED pixel"). The use of the open-ended claim language "comprising" along with the phrase "one and only one" to describe the pixel means that each OLED circuit element includes only a single pixel, but may include a variety of other items such as fuses, conductors, resistors, etc. As used in this context, a "pixel" or "OLED pixel" may include a first electrode, a second electrode, and an organic electroluminescent (EL) material disposed between the first and the second electrodes. The pixel of each of the OLED circuit elements may include a bottom or top emission organic light emitting diode, a stacked organic light emitting diode (SOLED), a transparent organic light emitting diode (TOLED), an inverted organic light emitting diode, and/or any other variation/combination of OLED. In general, each pixel may have at least one of either the first electrode, second electrode, and/or an organic layer that has been patterned such that the patterned elements are not common or shared with any other pixel. The patterned component of a pixel may, for instance, be either the first electrode or the second electrode. The pixel of each of the OLED circuit elements may correspond to the emissive area of the device from which light is emitted. In some embodiments (examples of which are described herein), in the first device as described above, a short in one pixel may not prevent the other pixels of the device from functioning properly—or from enabling the first device to continue to perform its intended function.

In some embodiments, the OLED circuit elements may include various other components and circuitry in addition to a fuse and the one pixel. For instance, an OLED circuit element may contain additional resistors, capacitors, inductors, voltage/current metering devices, voltage/current sources, diodes, transistors, and/or external fuses. However, as used herein and noted above, an "OLED circuit element" includes only one pixel. Additional circuit components not listed may also be included. Furthermore, a plurality of OLED circuit elements may share a common circuit component. For instance, in some embodiments multiple OLED circuit elements may share a common unpatterned layer such as an unpatterned electrode or organic layer.

In some embodiments, one or both electrodes may be patterned. The patterned electrode of each pixel may be physically segmented from the corresponding patterned electrode of each of the other pixels, but this may not necessarily mean that each pixel is physically isolated (i.e. that each pixel comprises a separate electrical "island"). That is, for example, in some embodiments, a fuse that connects to a patterned electrode may also connect to a bus line or may otherwise "physically connect" two patterned electrodes together (either directly or via other components of the device). In general, as would be understood by one of ordinary skill in the art, reference to "physical separation" or "physical segmentation" of the electrode of each pixel may refer to when the electrodes are pixilated such that if a fuse opens an electrical circuit corresponding to the electrode, current will no longer flow through the pixel that includes that particular electrode, but current may still flow through the other pixels of the device.

The OLED circuit elements may also include a fuse. The fuse or fuses of the OLED circuit elements may be adapted to open an electrical connection in response to an excess current in the pixel (or an excess current in a portion of the device that is near the pixel). A fuse may be configured to operate according to any suitable method including, but not limited to, melting, burning, ablating, cracking or chemical or physical modification of fuse in response to an excess current. If an excess current occurs in one of the OLED circuit elements, the increased current through the OLED circuit element may cause the fuse to open the circuit, thereby converting a short failure to an open failure. In this manner, in some embodiments, the OLED circuit element may thereby be electrically isolated from the other components of the first device. In some embodiments, each of the OLED circuit elements may not be electrically connected in series with any other of the OLED circuit elements. In this manner, when an OLED circuit element is open (i.e. when a fuse isolates the OLED circuit element or components thereof), current still flows to the other OLED circuit elements in the first device.

In some embodiments, in the first device as described above, each of the OLED circuit elements that are connected to the same bus line may be electrically connected in parallel. By electrically connecting each of the OLED circuit elements that are connected to the same bus line in parallel, embodiments may provide a configuration such that if a short occurs in the pixel of one of the OLED circuit elements, the fuse may electrically isolate only OLED circuit element affected by the fault. This may thereby reduce the amount of emissive area that is affected by the short, potentially making such non-emitting area less noticeable to an observer.

In some embodiments, in the first device as described above, the organic EL material of each of the OLED circuit elements that are connected to the same bus line may each have an emission spectrum having a peak wavelength that is within 5% of one another. That is, for instance, each of the pixels of each of the OLED circuit elements that are electrically connected to a bus line may emit light having a peak wavelength that is the same or substantially the same (i.e. there may be less than a 5% variance across each pixel). In other words, in some embodiments, each of the pixels that are electrically connected to a bus line may emit the same, or substantially the same, color light. This may provide the advantage that the device may be more readily color tunable such that the luminance level of a group of OLED circuit elements that comprise pixels that emit the same, or substantially the same, color light may have their luminance increased or dimmed simultaneously (and to the same magnitude) allowing control of the contribution light emitted by that group of similar devices to the total emission spectrum of the device.

In some embodiments, in the first device as described above, the plurality of bus lines may comprise at least a first bus line and a second bus line, where the first bus line may be electrically connected to a first group of OLED circuit elements each comprising an organic EL material having an emission spectrum that has a first peak wavelength and the second bus line may be electrically connected to a second group of OLED circuit elements each comprising an organic EL material having an emission spectrum that has a second peak wavelength, where the first peak wavelength and the second peak wavelength are at least 5% different. An example of such embodiments is illustrated in FIG. 4 described above, where the first bus line may comprise one of the bus lines 412 and the first group of OLED circuit elements may comprise the Red pixels 415 with their corresponding fuses 401 connected to the one bus line 412; and the second bus line may comprise one of the bus lines 413 and the second group of OLED circuit elements may comprise the Green pixels 416 and the corresponding fuses 401 connected to the one bus line 413 (or the second bus line may comprise one of the bus lines 414 and the second group of OLED circuit elements may comprise the Blue pixels 417 with their corresponding fuses 401 connected to the one bus line 414). Such embodiments may, for instance, provide the advantage of separately addressing groups of commonly addressable OLED pixels having different peak wavelengths, and may thereby enable the device to adjust the relative contributions of the different emission spectra provided by each group of OLED pixels to control the overall chromaticity of the light emissions of the device.

In some embodiments, in the first device as described above where the first bus line may be electrically connected to a first group of OLED circuit elements each comprising an organic EL material having an emission spectrum that has a first peak wavelength and the second bus line may be electrically connected to a second group of OLED circuit elements each comprising an organic EL material having an emission spectrum that has a second peak wavelength, the first peak wavelength may be between 400 and 500 nm and the second peak wavelength may be between 560 and 590 nm. For example, the device may comprise a group of OLED circuit elements that emit substantially blue light (e.g. having peak wavelength between 400 and 500 nm) and a group of OLED circuit elements that emit substantially yellow light (e.g. between 560 and 590 nm), such that the emissions of each group of OLED circuit elements may be controlled relative to one another (i.e. the luminance of each group may be controlled through current or voltage supplied to the separately addressable bus lines) to provide a desired white point of the device (or any other desired chromaticity).

In some embodiments, in the first device as described above where the first bus line may be electrically connected to a first group of OLED circuit elements each comprising an organic EL material having an emission spectrum that has a first peak wavelength and the second bus line may be electrically connected to a second group of OLED circuit elements each comprising an organic EL material having an emission spectrum that has a second peak wavelength, the fuse of each of the OLED circuit elements in the first group of OLED circuit elements may each have a first melting current and the fuse of each of the OLED circuit elements in the second group of OLED circuit elements may each have a second melting current, and where the first and the second melting currents are within 5% of one another. That is, even through the groups of OLED circuit elements may have different emissive spectra (and thereby may have different current densities over the normal operating range of the device), as noted above, there may be a range of acceptable melting currents such that each of the OLED circuit elements may utilize the same, or substantially the same fuse (i.e. having the same or substantially the same melting current). This may reduce manufacturing costs and complexity because each of the fuses may be fabricated simultaneously. In some embodiments, the first melting current and the second melting current may be between 0.1 mA and 50 mA, which is a range of values that the inventors have found may be suitable for OLED circuit elements having a range of emissive spectrums in some common device applications. In some embodiments, preferred ranges for the first melting current and the second melting current may be between 1 mA and 50 mA.

In some embodiments, in the first device as described above where the first bus line may be electrically connected to a first group of OLED circuit elements each comprising an organic EL material having an emission spectrum that has a first peak wavelength and the second bus line may be electrically connected to a second group of OLED circuit elements each comprising an organic EL material having an emission spectrum that has a second peak wavelength, and where the fuse of each of the OLED circuit elements in the first group of OLED circuit elements has a first melting current and the fuse of each of the OLED circuit elements in the second group of OLED circuit elements has a second melting current, the first and the second melting currents may have a difference of greater than 5%. In some embodiments, the first melting current and the second melting current may be at least 10% different. In some embodiments, the first melting current and the second melting current may be at least 30% different. In some embodiments, the first melting current and the second melting current may be at least 50% different. That is, for example, the fuses may be selected and fabricated so that different fuses may be used with OLED circuit elements having different emissive spectra or for groups having a different total number of OLED circuit elements that are commonly addressable. For instance, each OLED circuit element comprising a pixel emitting substantially blue light may have a fuse with a melting current that is different from the fuses of the OLED circuit elements having a pixel that emits substantially yellow light. In this way, embodiments may optimize the fuse selection based on the normal operating currents and short currents for each of the OLED circuit elements. In some embodiments, the first melting current may be between 0.1 mA and 60 mA (which the inventors have found is a typical range for OLED circuit elements comprising a blue pixel); and the second melting current may be between 0.1 mA and 50 mA (which the inventors have found is a typical range for OLED circuit elements comprising a yellow pixel). In some embodiments, the first melting current may be between 1 mA and 60 mA (which the inventors have found is a preferred range for OLED circuit elements comprising a blue pixel); and the second melting current may be between 1 mA and 50 mA (which the inventors have found is a preferred range for OLED circuit elements comprising a yellow pixel).

In some embodiments, in the first device as described above, the plurality of bus lines may comprise at least a first bus line, a second bus line, and a third bus line. The first bus line may be electrically connected to a first group of OLED circuit elements comprising an organic EL material having an emission spectrum that has a first peak wavelength, the second bus line may be electrically connected to a second group of OLED circuit elements comprising an organic EL material having an emission spectrum that has a second peak wavelength, and the third bus line may be electrically connected to a third group of OLED circuit elements comprising an organic EL material having an emission spectrum that has a third peak wavelength. FIG. 4 provides an example of some such embodiments, in which the first bus line may comprise one of the bus lines 412 and the first group of OLED circuit elements may comprise the Red pixels 415 with their corresponding fuses 401 connected to the one bus line 412; the second bus line may comprise one of the bus lines 413 and the second group of OLED circuit elements may comprise the Green pixels 416 and the corresponding fuses 401 connected to the one bus line 413; and the third bus line may comprise one of the bus lines 414 and the third group of OLED circuit elements may comprise the Blue pixels 417 with their corresponding fuses 401 connected to the one bus line 414.

In this regard, in some embodiments, where the first device as described above comprises a first bus line electrically connected to a first group of OLED circuit elements, a second bus line electrically connected to a second group of OLED circuit elements, and a third bus line electrically connected to a third group of OLED circuit elements, the first peak wavelength of the emission spectrum of the EL material of the first group of OLED circuit elements may be between 400 and 500 nm, the second peak wavelength of the emission spectrum of the EL material of the second group of OLED circuit elements may be between 500 and 580 nm, and the third peak wavelength of the emission spectrum of the EL material of the third group of OLED circuit elements may be between 580 and 700 nm. That is, for instance, the device may comprise OLED circuit elements that emit red light, green light, and blue light, such that each of the OLED circuit elements that emit red light may be commonly addressable, each of the OLED circuit elements that emit green light may be commonly addressable, and each of the OLED circuit elements that emit blue light may be commonly addressable. This may enable embodiments to adjust the relative contributions of each group of OLED circuit elements to color tune (or dim) the device. However, embodiments are not so limited, and one or more OLED circuit elements that have pixels that emit light having different chromaticities may be commonly addressable in some embodiments.

In some embodiments, where the first device as described above comprises a first bus line electrically connected to a first group of OLED circuit elements, a second bus line electrically connected to a second group of OLED circuit elements, and a third bus line electrically connected to a third group of OLED circuit elements, the fuse of each of the OLED circuit elements in the first group of OLED circuit elements may have a first melting current, the fuse of each of the OLED circuit elements in the second group of OLED circuit elements may have a second melting current, and the fuse of each of the OLED circuit elements in the third group of OLED circuit elements may have a third melting current. In some embodiments, the first, the second, and the third melting currents may be within 5% of one another. As noted above, even though embodiments may have groups of OLED circuit elements that may comprise different emissive properties (and may thereby have different maximum and minimum operating currents), there may be sufficient overlap in the range of acceptable melting currents for each of the fuses that the fuses of each OLED circuit element may be substantially the same. This may be the case even for embodiments that comprise three different emitters. In some embodiments, the first melting current, the second melting current, and the third melting current may be between 0.1 mA and 50 mA, which the inventors have found may be a range of melting currents that may be acceptable for OLED circuit elements comprise red, green, and blue pixels for some common applications. In some embodiments, the first melting current, the second melting current, and the third melting current may be between 1 mA and 50 mA, which the inventors have found may be a preferred range of melting currents that may be acceptable for OLED circuit elements comprise red, green, and blue pixels for some common applications.

However, as noted above embodiments are not so limited, and in some embodiments, where the first device as described above comprises a first bus line electrically connected to a first group of OLED circuit elements, a second bus line electrically connected to a second group of OLED circuit elements, and a third bus line electrically connected to a third group of OLED circuit elements, and where the fuse of each of the OLED circuit elements in the first group of OLED circuit elements has a first melting current, the fuse of each of the OLED circuit elements in the second group of OLED circuit elements has a second melting current, and the fuse of each of the OLED circuit elements in the third group of OLED circuit elements has a third melting current, the first, the second, and the third melting currents may have a difference that is greater than 5%. In some embodiments, the first melting current, the second melting current, and the third melting current may be at least 30% different. In some embodiments, the first melting current and the second melting current may be at least 10% different, the first melting current and the third melting current may be at least 10% different, and the second melting current and the third melting current may be at least 10% different. In this manner, the fuses may be chosen based on the particular properties of each of the OLED circuit elements (or groups of commonly addressable OLED circuit elements) so as to optimize the performance of the device for a particular application (i.e. to reduce the number of false positives in which a fuse opens when there is not a short, as well as the number of false negatives when a fuse does not open when a short occurs—which may cause damage to other parts of the device).

In some embodiments, where the first device as described above comprises a first bus line electrically connected to a first group of OLED circuit elements, a second bus line electrically connected to a second group of OLED circuit elements, and a third bus line electrically connected to a third group of OLED circuit elements, and where the fuse of each of the OLED circuit elements in the first group of OLED circuit elements has a first melting current, the fuse of each of the OLED circuit elements in the second group of OLED circuit elements has a second melting current, and the fuse of each of the OLED circuit elements in the third group of OLED circuit elements has a third melting current, the first melting current may be between 0.1 mA and 60 mA (which the inventors have found is a typical range for melting currents that may correspond to blue OLED circuit elements); the second melting current may be between 0.1 mA and 50 mA (which the inventors have found is a typical range for melting currents that may correspond to green OLED circuit elements); and the third melting current is between 0.1 mA and 100 mA (which the inventors have found is a typical range for melting currents that may correspond to red OLED circuit elements). The inventors have found that the range for the Red OLED circuit elements may be larger than the ranges for green or blue OLED circuit elements, which may be due to the higher driving currents that are typically associated with some red emitters for similar luminance levels. In some embodiments, the first melting current may be between 1 mA and 60 mA (which the inventors have found is a preferred range for melting currents that may correspond to blue OLED circuit elements); the second melting current may be between 1 mA and 50 mA (which the inventors have found is a preferred range for melting currents that may correspond to green OLED circuit elements); and the third melting current is between 1 mA and 100 mA (which the inventors have found is a preferred range for melting currents that may correspond to red OLED circuit elements).

In some embodiments, where the first device as described above comprises a first bus line electrically connected to a first group of OLED circuit elements, a second bus line electrically connected to a second group of OLED circuit elements, and a third bus line electrically connected to a third group of OLED circuit elements, the first device may further comprise a fourth bus line. The first bus line may be electrically connected to a first group of OLED circuit elements comprising an organic EL material having an emission spectrum that has a first peak wavelength, the second bus line may be electrically connected to a second group of OLED circuit elements comprising an organic EL material having an emission spectrum that has a second peak wavelength, the third bus line may be electrically connected to a third group of OLED circuit elements comprising an organic EL material having an emission spectrum that has a third peak wavelength, and the fourth bus line may be electrically connected to a fourth group of OLED circuit elements comprising an organic EL material having an emission spectrum that has a fourth peak wavelength. In some embodiments, the first peak wavelength is between 400 and 470 nm (i.e. deep blue), the second peak wavelength is between 500 and 580 nm, the third peak wavelength is between 580 and 700 nm, and the fourth peak wavelength is between 470 and 500 nm (i.e. light blue). As described above, the inventors have found that such RBGB devices may provide for both improved lifetime (based on the use of the light blue and deep blue emitters) without substantially limiting the range of chromaticities of the device (or the white point of the device).

In some embodiments, in the first device as described above, the first device may be color tunable and/or dimmable. Color tunable embodiments may provide advantages over devices such as white lighting panels that may, for instance, comprise a single OLED or a plurality of OLED pixels that are commonly addressable. For example, a color tunable device may be used in a variety of different applications that may require a range of chromaticities and such devices may even be utilized to select different white points for a device. Moreover, color tunable embodiments may be used to adjust the white balance of the device as the various OLED circuit elements begin to degrade over time. As organic devices begin to degrade, the luminance of such devices may also begin to decrease even when driving at the same current density. In addition, different emitters (e.g. red, green, and blue electro-luminescent materials) typically degrade at different rates. This may result in the chromaticity of the white light emitted from such a device to begin to shift. Embodiments provided herein that may be color tunable could extend the operational lifetime of such devices, or improve device performance, by adjusting the relative current densities provided to OLED circuit elements comprising different emitting materials as each of these elements begins to differentially age.

In some embodiments, in the first device as described above, the plurality of bus lines may comprise at least a first bus line and a second bus line, where the first bus line may be electrically connected to a first group of OLED circuit elements comprising an organic EL material having an emission spectrum that has a first peak wavelength and the second bus line may be electrically connected to a second group of OLED circuit elements comprising an organic EL material having an emission spectrum that has a second peak wavelength, and where the first peak wavelength and the second peak wavelength may be different, the first device may be configured to drive each of the plurality of OLED circuit elements at a plurality of luminance levels, where the plurality of luminance levels comprises a minimum luminance level and a maximum luminance level. Configurations, such as the one described above, that may enable different groups of OLED circuit elements to be driven at different luminance levels (e.g. by providing different currents or voltages through two or more separately addressable bus lines), may enable the device to be color tunable and/or dimmable. This may be the case for some embodiments, such as the one described above, in which the organic EL material of each of the OLED circuit elements that are electrically connected to a bus line (and may thereby be commonly addressable) is the same or substantially the same. In this way, embodiments may enable OLED circuit elements that emit light having substantially the same chromaticity to be adjusted simultaneously, and to luminance levels that may be the same or substantially the same.

In some embodiments, the maximum luminance level may be at least two times greater than the minimum luminance level. In general, there can be any number of different luminance levels for the various OLED circuit elements, and these levels may be varied discretely or continuously. That is, for instance, the variation of the driving current can be continuous or discontinuous, which may in turn result in a continuous variation in luminance or a discontinuous change in luminance, respectively. In some embodiments, the maximum luminance level may be at least five times greater than the minimum luminance level. In some embodiments, the maximum luminance level may be at least ten times greater than the minimum luminance level. In general the greater the difference between the maximum and minimum luminance levels, the wider the range of chromaticities of the total light emission (i.e. the combination of light emitted by each of the OLED circuit elements) from the device may be provided.

In some embodiments, in the first device as described above that comprises a first bus line electrically connected to a first group of OLED circuit elements comprising an organic EL material having an emission spectrum that has a first peak wavelength and a second bus line electrically connected to a second group of OLED circuit elements comprising an organic EL material having an emission spectrum that has a second peak wavelength, where the first device may be configured to drive each of the plurality of OLED circuit elements at a plurality of luminance levels, the first group of OLED circuit elements and the second group of OLED circuit elements may comprise the same number of OLED circuit elements. In some embodiments, the first group of OLED circuit elements and the second group of OLED circuit elements may comprise a different number of OLED circuit elements. As noted above, although some embodiments may provide for an equal number of OLED circuit elements that may be coupled to each of the separately addressable bus lines and/or that may have different electro-luminescent materials (i.e. the same number of blue, green and red OLED circuit elements, etc.), the inventors have also fond that in some instances, there may be benefits to varying the number of OLED circuit elements. For instance, it may be beneficial, as shown in FIG. 7 and described above, to increase the number of OLED circuit elements that have the shorter device lifetime so that these devices could be driven at lower current densities. It may also be beneficial, for instance, when a device is intended to provide a color tint or hue for a specific application to provide a variance in the number OLED circuit elements having a particular organic EL material or materials.

In some embodiments, in the first device as described above that comprises a first bus line electrically connected to a first group of OLED circuit elements comprising an organic EL material having an emission spectrum that has a first peak wavelength and a second bus line electrically connected to a second group of OLED circuit elements comprising an organic EL material having an emission spectrum that has a second peak wavelength, where the first device may be configured to drive each of the plurality of OLED circuit elements at a plurality of luminance levels including a maximum and a minimum level, the maximum luminance level may be at least N times greater than the minimum luminance level, where the first group of OLED circuit elements and the second group of OLED circuit elements may each comprise at least N OLED circuit elements. That is, as was described above, the use of a plurality of pixels may provide embodiments with increased flexibility in the number of luminance levels that a plurality of commonly addressable OLED circuit elements may be operated at because a device may generally comprise a large number of pixels in a relatively small area (particularly in comparison to light stripe embodiments. In some embodiments, the first group of OLED circuit elements and the second group of OLED circuit elements may each comprise at least 2*N OLED circuit elements.

In some embodiments, in the first device as described above that comprises a first bus line electrically connected to a first group of OLED circuit elements each comprising an organic EL material having an emission spectrum that has a first peak wavelength and a second bus line electrically connected to a second group of OLED circuit elements each comprising an organic EL material having an emission spectrum that has a second peak wavelength, where the first device may be configured to drive each of the plurality of OLED circuit elements at a plurality of luminance levels including a maximum and a minimum level, the maximum luminance level may be at least two times greater than the minimum luminance level and the first group of OLED circuit elements and the second group of OLED circuit elements may each comprise at least 2 OLED circuit elements. In some embodiments, the maximum luminance level may be at least five times greater than the minimum luminance level and the first group of OLED circuit elements and the second group of OLED circuit elements may each comprise at least 5 OLED circuit elements. In some embodiments, the maximum luminance level is at least 10 times greater than the minimum luminance level and the first group of OLED circuit elements and the second group of OLED circuit elements may each comprise at least 10 OLED circuit elements.

In some embodiments, in the first device as described above, each of the plurality of bus lines may be electrically connected to at least 20 OLED circuit elements. In some embodiments, each of the plurality of bus lines may be electrically connected to at least 50 OLED circuit elements. In some embodiments, each of the plurality of bus lines may be electrically connected to at least 100 OLED circuit elements.

In some embodiments, in the first device as described above, the plurality of bus lines may comprise a first group of commonly addressable bus lines and a second group of commonly addressable bus lines, where each of the bus lines of the first group of commonly addressable bus lines may be electrically connected to a first group of OLED circuit elements each comprising an organic EL material having an emission spectrum that has a first peak wavelength and each of the bus lines of the second group of commonly addressable bus lines is electrically connected to a second group of OLED circuit elements that each comprise an organic EL material having an emission spectrum that has a second peak wavelength. The first peak wavelength and the second peak wavelength may be different. In some embodiments, the first group of commonly addressable bus lines and the second group of commonly addressable bus lines may be separately addressable. That is, for instance, some embodiments may comprise multiple bus lines that are also commonly addressable (i.e. that may comprise a group of bus lines). Each of these groups of bus lines may in turn be separately addressable from one another. An example of this is shown in FIG. 4 and described above, where bus lines 412 (each electrically connected to a plurality of red OLED circuit elements) form a first group of commonly addressable bus lines; bus lines 413 (each electrically connected to a plurality of green OLED circuit elements) form a second group of commonly addressable bus lines; and bus lines 414 (each electrically connected to a plurality of blue OLED circuit elements) form a third group of commonly addressable bus lines, and where each of these groups of bus lines is separately addressable (e.g. connected to a different addressing line 402-404). In some embodiments, the bus lines that comprise the first group of commonly addressable bus lines may be electrically connected in parallel, the bus lines that comprise the second group of commonly addressable bus lines may be electrically connected in parallel, and/or the bus lines that comprise the third group of commonly addressable bus lines may be electrically connected in parallel.

In some embodiments, in the first device as described above, the first electrode of each of the plurality of OLED circuit elements may be patterned. As would be appreciated by one of skill in the art, the patterning of an electrode such that a plurality of physically separate electrodes are formed that may correspond to each of the pixels does not necessarily mean that each electrode is physically isolated (i.e. that each electrode or pixel comprises a separate electrical "island"). The electrodes may be physically separate components, but may be connected via one or more components, such as through a fuse. In some embodiments, the first electrode of each of the plurality of OLED circuit elements may be electrically connected to one of the plurality of bus lines through the fuse.

In some embodiments, in the first device as described above where the first electrode of each of the plurality of OLED circuit elements is patterned and is electrically connected to one of the plurality of bus lines through the fuse, the first electrode and the fuse of each of the plurality of OLED circuit elements may be fabricated simultaneously. In some embodiments, the first electrode and the fuse of each of the plurality of OLED circuit elements may comprise the same material. That is, for instance, the fuse and the electrode may be fabricated using the same material and/or using the same process (e.g. deposited simultaneously, patterned from the same base layer of material using lithography, etc.), which may provide some advantages in comparison to fabricating the fuse using a different material than the electrode (such as the same material as the bus line), particularly in reducing fabrication costs and time. Moreover, the materials that comprise a bus line are typically much more conductive than materials that may be used for other components such as the electrodes. Thus, if the fuse were to comprise such a material, for it to operate properly and open an electrical circuit in response to excess current, the dimensions of the fuse (such as a cross-sectional area) would likely be extremely small. A fuse having extremely small relative dimensions may be difficult and expensive to manufacture. In contrast, for embodiments in which the fuse comprises a more resistive material, the dimensions may be larger, while still maintaining the properties necessary for the fuse to function properly, and thereby make manufacture of device easier and more cost effective.

In this regard, in some embodiments, the first electrode and the fuse of each of the plurality of OLED circuit elements may be integrally coupled. As used in this context, "integrally coupled" may refer to when the fuse and the first electrode are fabricated in the same manufacturing step and comprise the same material (or substantially the same material) such that the fuse may be viewed as a component of the electrode (but may have different dimensions, such as its width, length, thickness). In this regard, the fuse itself may not comprise a "separate" component, but may be a continuous extension of the first electrode; however, the fuse may be designed such that as an excess current begins to flow through the first electrode, the fuse opens the electrical circuit.

In some embodiments, each of the fuses of the OLED circuit elements may comprise a transparent conductive oxide (TCO).

In some embodiments, the first device further comprises a color mixing mechanism, which may also be referred to as a color mixing strategy. A color mixing mechanism generally involves a diffuser, which sits between a source of light and a viewer. The source of light may include discrete sources of different colors, such as different OLED pixels or lines of OLED pixels, that would be discernible to a viewer in the absence of the color mixing mechanism. The color mixing mechanism blends the light to make the discrete colors less discernible to a viewer. A diffuser may be incorporated into the first device in a variety of ways. Preferably, a light extraction block is disposed between the light source and the diffuser. The light extraction block preferably has an index of refraction that is matched with any separate substrate that may be present. However, other configurations may be used, such as an air gap between a light source and a diffuser.

In some embodiments, in the first device as described above where the first electrode of each of the plurality of OLED circuit elements is patterned and is electrically connected to one of the plurality of bus lines through the fuse, the fuse of each of the OLED circuit elements and the bus line that it is electrically connected to may comprise substantially the same material. In some embodiments, the fuse of each of the OLED circuit elements and the bus line that it is electrically connected to may comprise the same material. In some embodiments, the fuse of each of the OLED circuit elements and the bus line that it is electrically connected to may be integrally coupled. That is, although as described above it may be preferred in some embodiments that the fuse comprises the same material as the first electrode, embodiments are not so limited and in some instances, the fuse may comprise the same material as the bus line and/or be fabricated simultaneously with the bus line.

Exemplary Fuses and Fuse Design

The parameters of a fuse that may be used in embodiments disclosed herein, such as materials and dimensions, may be readily selected by one of skill in the art to accommodate a desired normal operating current, melting current, and short circuit current. Examples of fuses and methods for selecting design parameters are described in more detail below and are also described in U.S. patent application Ser. No. 13/349,295 filed on Jan. 12, 2012, which is incorporated herein by reference in its entirety.

Although embodiments may describe fuses that open an electrical circuit based on a particular method (such as ablation of the fuse), as noted above, fuses may in general open an electrical circuit in any suitable method.

In general, any suitable fuse or configuration may be used in embodiments described herein. For example, in some embodiments, the fuse may be a separable component from the pixel (i.e. separate from the first electrode, the second electrode, and the organic layer), and the fuse may be connected in series with the pixel of each of the OLED circuit elements. When an excess current flows through the pixel (and thereby the fuse because of the series connection), it may cause the fuse to open. Moreover, because the fuse is in series with the pixel, the excess current cannot continue to flow through the pixel after the fuse opens the electrical connection. In some embodiments, the first or the second electrode in each of the plurality of OLED circuit elements may be the fuse. That is, for instance, the first or the second electrode may be designed or configured to comprise parameters such that it will open an electrical connection in response to an excess current.

As described above, in general when a fuse is opened, it causes a short fault to become an open fault and current is thereby prevented from flowing through the shorted pixel. For some embodiments where the first or the second electrode is a fuse, the electrode may have a thickness such that, in response to an excess current in the OLED circuit element, the electrode is ablated. In such embodiments, the thickness of the electrode may refer to the dimension of the electrode that is along the axis that is substantially perpendicular to the plane of the substrate. The thickness of an electrode that functions as a fuse may be a function of such conditions and parameters as the electrode material, the normal device operating current, and the short-circuit current (i.e. the current that will flow through the electrode if a short occurs). Any material and thickness may be used as would be understood by one of ordinary skill in the art so long as the electrode functions as a fuse at a desired melting current. For example, the inventors have found that for some embodiments, the electrode may have a thickness between 1 nm and 60 nm and/or the material may be a conductive metal such as aluminum.

As noted above, any suitable fuse configuration and fuse design may be utilized in the embodiments provided herein. Provided below are some examples of fuses, as well as exemplary techniques that may be employed in choosing the parameters and characteristics of the fuses to operate in some embodiments. It should be appreciated that the discussion below is provided for illustration purposes only, and is not intended to be limiting.

In general, a more conductive (less resistive) material may act as a fuse for given current levels at smaller dimensions than a less conductive material. This may be due, in part, to the decrease in resistivity of the more conductive material, where the heat generated by a current passing through the fuse is based at least in part on the resistivity of the material of the fuse (i.e. the joule heating in the fuse is proportional to the amount of square of the current (I) times the resistance of the fuse (R)). Any material and any dimensions of a fuse are contemplated herein so long as the component functions properly as a fuse in the OLED.

As noted above, one of skill in the art may readily select parameters of the fuse (such as the materials and dimensions of the fuse) based on the normal operating current and the expected or predicted short circuit current so as to provide a fuse having melting current such that the fuse is designed to open the electrical connection at a desired current in relation to the maximum operating current. Preferably, the melting current of the fuse may be greater than the normal pixel operating current, and preferably less than or equal to the short circuit current (usually the total panel current). By designing the fuse to conduct electricity at (and preferably slightly above) the normal pixel operating current, but below the short circuit current, embodiments may provide for a device that operates normally when a short does not occur but will isolate a portion of the device if a short occurs (or begins to occur).

As noted above, some embodiments may comprise a plurality of OLED circuit elements each comprising a fuse. If one of the fuses is opened, then in some instances, there may be an increase in current that flows through the other OLED circuit elements during normal operation at a given luminance level. Therefore, it may be preferred, in some embodiments, that the fuse has a melting current that takes this increase current during normal operation into consideration. However, as was detailed above, if the fuse has a melting current that is set above the short circuit current, when a short occurs, the fuse may not open and thereby the device may be rendered inoperable. Depending upon the specific application of the device, it may be desirable to have a highly sensitive fuse that opens in response to a current that is only slightly higher than the maximum pixel operating current, or it may be desirable to have a less sensitive fuse that allows a significant excess current to flow prior to opening the fuse. For example, it may be preferred that the fuse opens in response to an excess current that is 10%, 50%, 100%, 200%, or even 400% greater than the maximum pixel operating current. Where there is a range of operating currents (for example, such that the luminance of the OLED light panel may be controlled or the device may be color tunable), the melting current of the fuse should typically be greater than the maximum pixel operating current (i.e. the current that is provided when the device is operating at its highest current at which the device is designed to operate). The melting current of the fuse may also be designed to be less than the minimum short circuit current (i.e. the current that is provided when there is an electrical short when the device is operating at its lowest current at which the device is designed to operate).

The fuses may connect the first electrode of each OLED circuit elements to a bus line in some embodiments. Generally, fuse materials used in such embodiments may comprise TCOs, such as ITO or IZO. The cross-sectional area of the fuse may typically be designed so as to be large enough to ensure sufficiently high conductivity, yet small enough to ensure sufficiently high transparency (such that the fuses do not significantly impede the light emitted from the device). In some embodiments, where the fuse and electrode are patterned from the same material, at substantially the same time, and/or to substantially the same thickness, some properties of the fuse may be determined by parameters preferred for the electrode performance. For example, where it is desired that the electrode is transparent, the fuse material and thickness may be selected with this criteria in mind. Other fuse parameters (such as the width of the fuse) may also be used to ensure that the fuse functions as a fuse (that is, so that the fuse opens the electrical connection in response to an excess current). The inventors have found that a preferred range of the thickness of the fuse in some embodiments may be between 10 nm and 300 nm.

In addition to the thickness of the fuse, the ratio of the length of the fuse to the width of the fuse in some embodiments may preferably be low enough such that the fuse is conductive under normal operation (i.e. the length divided by the width is sufficiently low), but be high enough so as to generate enough heat to burn the fuse upon the occurrence of an excess current through the fuse (i.e. the length divided by the width is sufficiently high). As would be understood by one of ordinary skill in the art, the fuse may also open an electrical circuit in response to an excess current in any suitable manner, including ablating, cracking, or any of the other known methods described above. That is, generally the greater the width of the fuse, the less resistance the component will have and the greater the current needed to open the fuse. In contrast, generally the longer the length of the fuse, the greater the resistance and thereby the less current that may be needed to open the fuse. The inventors have found in this regard that a preferred range for the fuses is to have a length-to-width ratio between 0.1 and 5.0. However, any length to width ratio that enables the fuse to open an electrical connection in response to an excess current, such as when a short circuit occurs (or begins to occur), is contemplated as within these embodiments.

A general set of design rules developed by the inventors for incorporating fuses in a lighting panel are described below for exemplary purposes only. First, the working condition of the lighting panel may need to be determined, which usually refers to the desired luminance levels. Based on the current density-voltage-luminance (JVL) relationship, the driving condition at designated luminance levels may be determined. If the panel is designed to be dimmable and/or color tunable, which means the panel may work at various luminance levels (e.g. from 500 cd/m$^2$ to 5000 cd/m$^2$), the working condition may also vary according to the luminance. Moreover, if some of the devices are separately addressable, then these conditions may be applied to each group of pixels that are commonly addressable (e.g. the working conditions of each group of pixels that are electrically connected to the same bus line may be considered in determining the fuses). An example of this process with regard to a device in which pixels that comprise different organic EL materials were connected to separately addressable bus lines was described above. In this exemplary case, minimum ($I_{min}$) and maximum ($I_{max}$) current may be determined as the total current going through all the commonly addressable pixels based on the lowest and highest luminance levels (assuming a constant-current driving configuration). For example, assuming the panel has n commonly addressable pixels connected to a bus line (or group of bus lines) that have the same (or approximately the same) emissive areas and device structures, the total current may be approximately equally divided, and each pixel will then have the minimum and maximum pixel current of approximately $I_{min}/n$ and $I_{max}/n$.

In general, the melting current ($I_M$) of the fuse should be greater than the maximum pixel current (e.g. $I_{max}/n$), yet lower than the minimum panel current (e.g. $I_{min}$). The fuses may be designed to open either at a low or high current level depending on the specification of the panel and/or the application it is intended to be used for. For example, $I_M$ (the melting current) may be set at a relatively low point closer to $I_{max}/n$, so that any excess current greater than the rated current will open up the fuse. In such circumstances, if a short develops (or begins to develop) in a pixel, the fuse may burn very quickly and isolate the shorting pixel from the normally operating ones, which may prevent the accumulation of local heating and safely protect the rest of the panel. This approach may favor an initial panel screening process, where any potential shorting is preferred to be detected and eliminated as fast as possible. On the other hand, in some embodiments, $I_M$ may be designed at a relatively high current level closer to $I_{min}$, so that the circuit can sustain some degree of excess current surge without shutting off any normally operating pixels.

Figure 9:
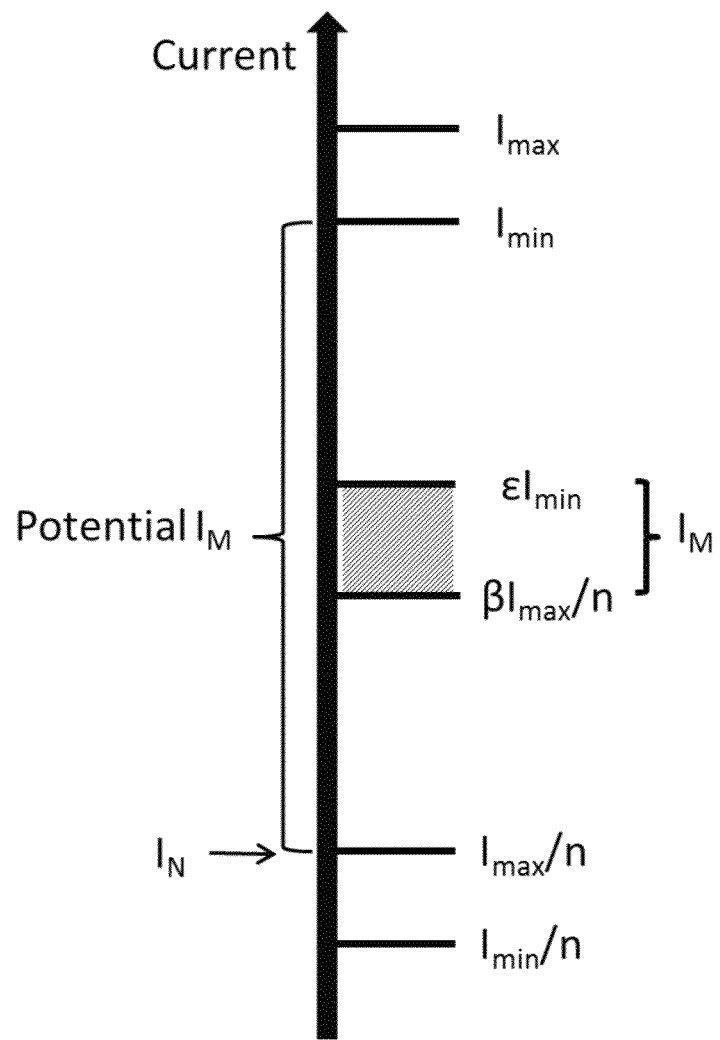
FIG. 9 is a graphical illustration of the different currents of an OLED circuit element, including exemplary values for melting currents $I_M$ of a fuse in accordance with some embodiments.

In general, there may be various ways to choose the melting current $I_M$ of a fuse or fuses based on a customized specification. In practice, instead of setting $I_M$ right at $I_{max}/n$ or $I_{min}$, the melting current may typically be set somewhere above $I_{max}/n$ and/or somewhere below $I_{min}$ so as to leave some tolerance (e.g. this will permit some initial increase in current or fluctuation). For example, with the opening of fuses (e.g. during operation of embodiments that may comprise fuses connected in series with each pixel), the total number of commonly addressable and/or pixels electrically connected in parallel (n) decreases dynamically, which results in the increasing of the current supplied to each pixel based on $I_{max}/n$. Therefore, more tolerance may be needed above the current $I_{max}/n$, to avoid electrically isolating normally operating pixels when the total number of pixels goes down. In some embodiments, $I_M$ may be designed as $\beta(I_{max}/n)$, where $\beta$ is greater than 1. In some embodiments, $I_M$ may be designed as $\epsilon(I_{min})$, where $\epsilon$ is less than 1. In some embodiments, $I_M$ may be designed to fall within a range of $[\beta(I_{max}/n), \epsilon(I_{min})]$. FIG. 9 provides a graphical illustration of the relationship of the currents described above, where the region labeled "Potential $I_M$" refers to the values of the melting current of the fuses that may be selected such that the device may function properly, and the shadow region labeled "$I_M$" represents the designated $I_M$ for a particular embodiment. For instance, a melting current may be set at two times greater than the maximum pixel current, i.e., $\beta=2$, and $I_m \geq 2 \cdot (I_{max}/n)$. If the maximum current through a group of commonly addressable pixels $I_{max}=200$ mA, and the total number of pixels in the group n=20000, then the melting current $I_M \geq 2 \times (200/20000$ mA$)=0.02$ mA.

After the melting current and resistance are determined for the fuse, the geometric shape and the material of the fuse can be decided according to the experimental results or known characteristics of components, in association with the process capability.

Device Data

Figure 10:
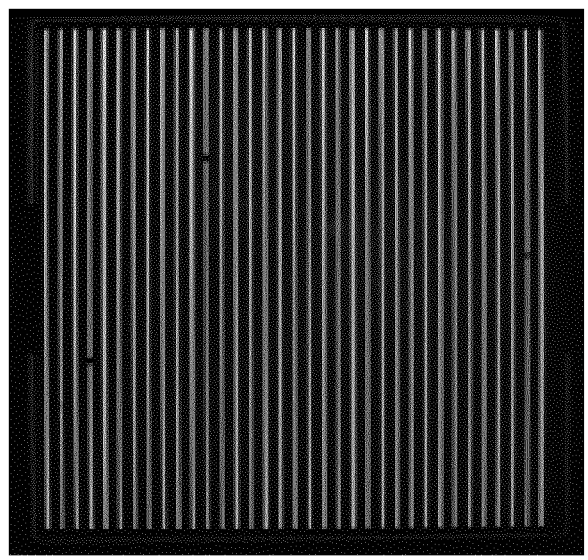
FIG. 10 shows a photo image of a panel having red, green and blue stripes, with only red stripes illuminating.
Figure 11:
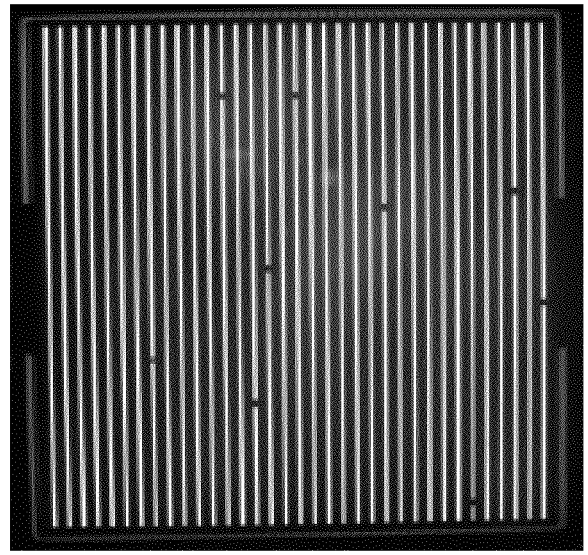
FIG. 11 shows a photo image of a panel having red, green and blue stripes, with only green stripes illuminating.
Figure 12:
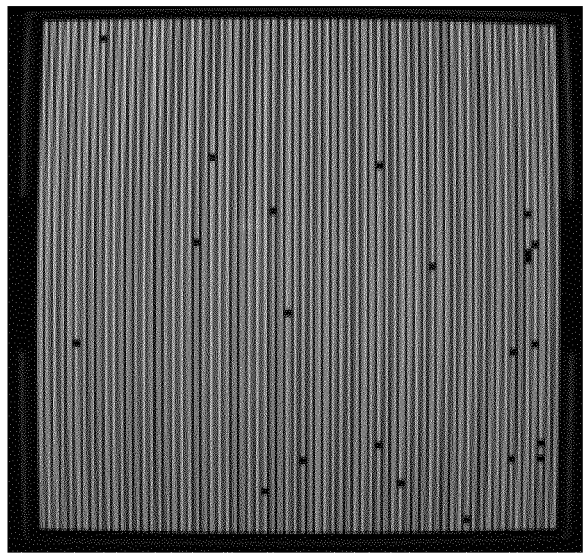
FIG. 12 shows a photo image of a panel having red, green and blue stripes, with only blue stripes illuminating.
Figure 13:
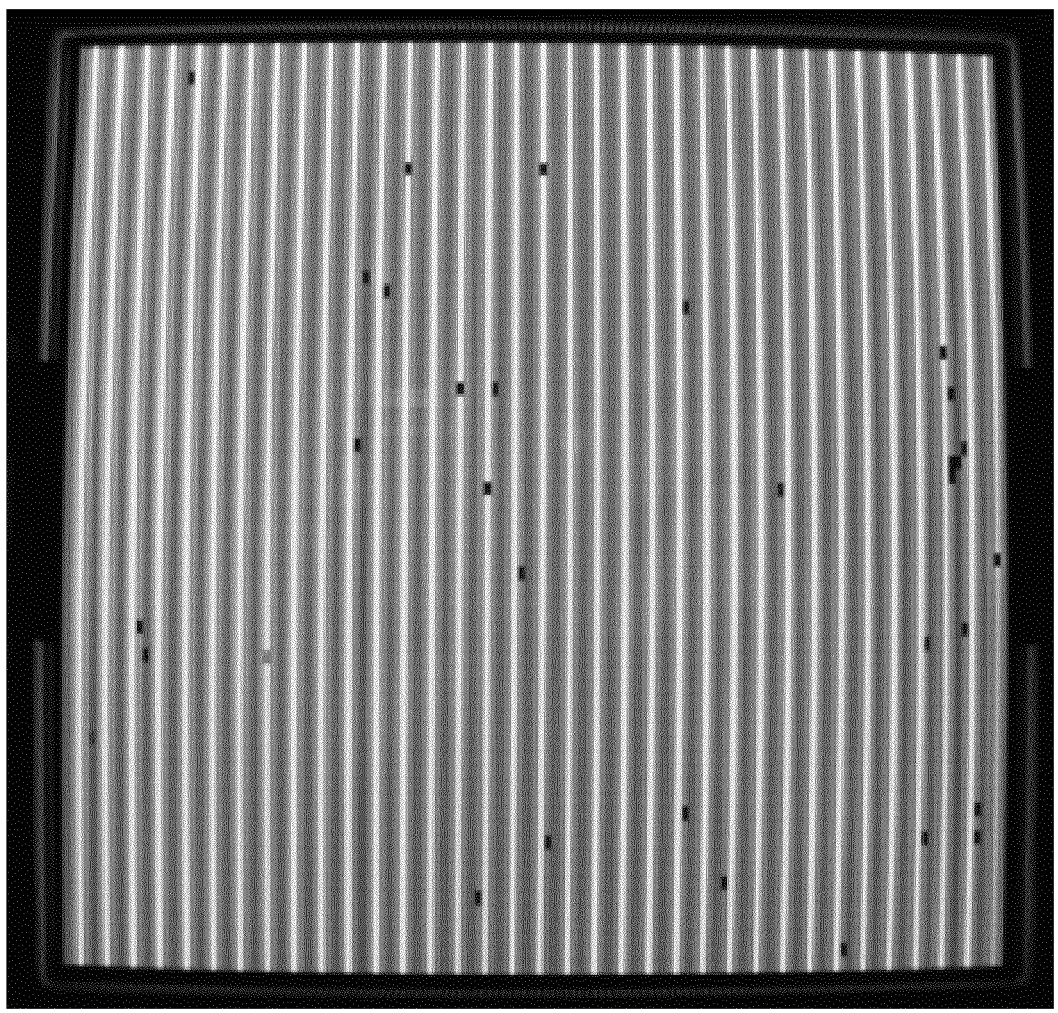
FIG. 13 shows a photo image of the panel with all red, green and blue stripes lighting up.
Figure 14:
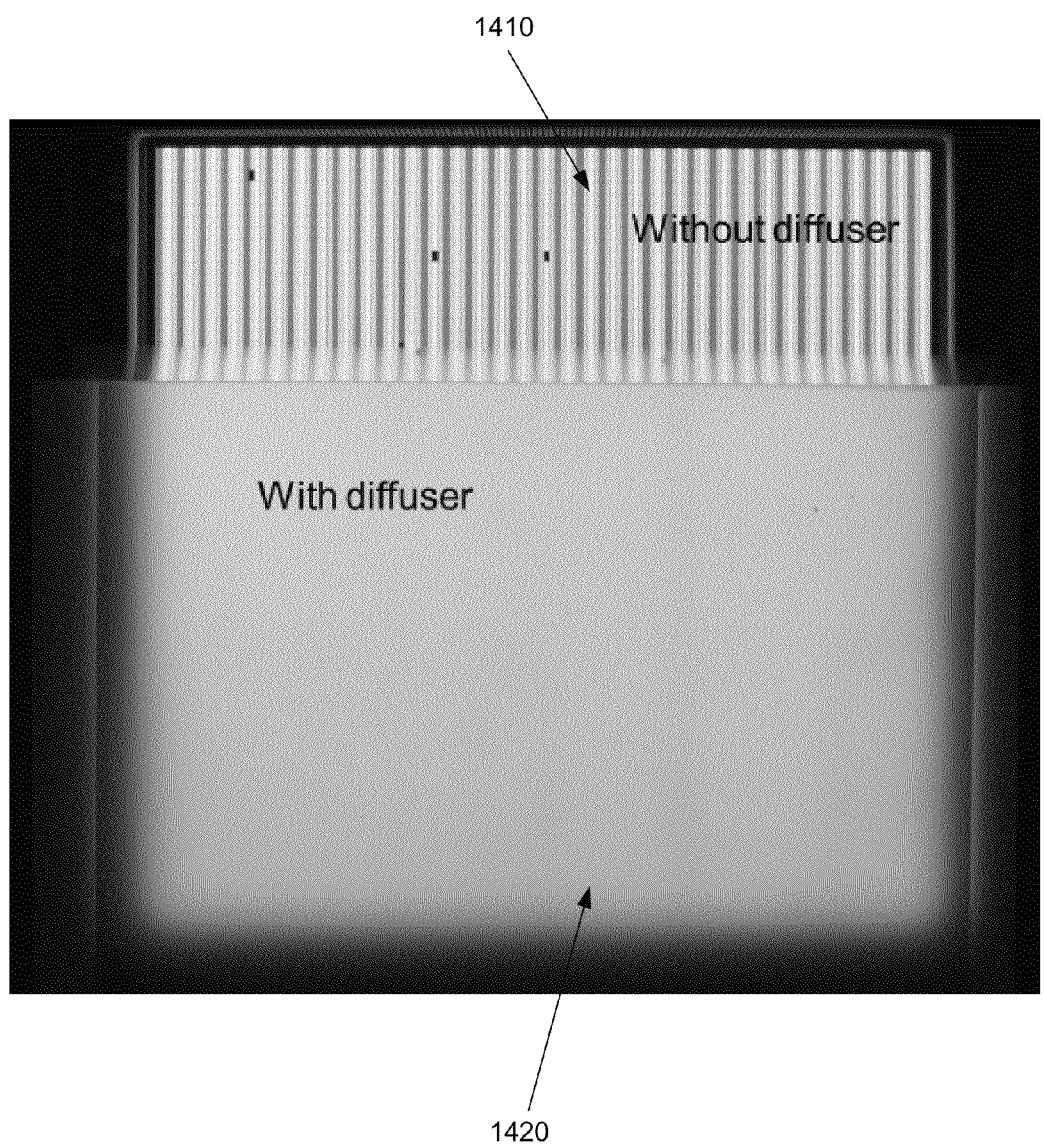
FIG. 14 shows a photo image of the panel with all three colors illuminating, where the top part of the panel is not attached to any diffuser or color mixture strategy while a diffuser sheet in combination with an 18 mm thick acrylic block is applied on the bottom part of the panel.

An example of a large-area color tunable lighting panel was fabricated. The panel was fabricated according to the layout described above, and integrated with fuses. The OLED material or device structure is not important to the results described. In general, any device structure may be used here. FIGS. 10-12 show photo images of the panel with only red, green and blue stripes illuminating, respectively. The dark spots are dead pixels, whose fuses opened up the circuitry in response to an electrical short that occurred inside the active area. FIG. 13 shows a photo image of the panel with all red, green and blue stripes lighting up. FIG. 14 further shows the photo image of the panel with all three colors illuminating, where the top part 1410 of the panel is not attached to any diffuser or color mixture strategy while a diffuser sheet in combination with an 18 mm thick acrylic block is applied on the bottom part 1420 of the panel. The diffuser mixes the individual colors and converts them into white emission without noticeable segmented color. Note that, the block may not be essential in order to mix the colors into white, because in principle, so long as there is a spacing between the emission surface of the panel to the diffuser, using diffuser alone may eliminate the segmented appearance. Nevertheless, adding block may enhance light extraction and hence the efficiency of the panel. Applying a diffuser sheet is one example, and any color mixture mechanism may be used. In some embodiments, no color mixing mechanism is provided. It can be seen that with the diffuser sheet attached, any dead pixel is non-visible owing to its relative small area. This is a great advantage as discussed earlier over the conventional panel layout where the whole stripe is connected to the fuse, and therefore if a short occurs, the entire stripe would be dark which is much more noticeable.

Figure 15:
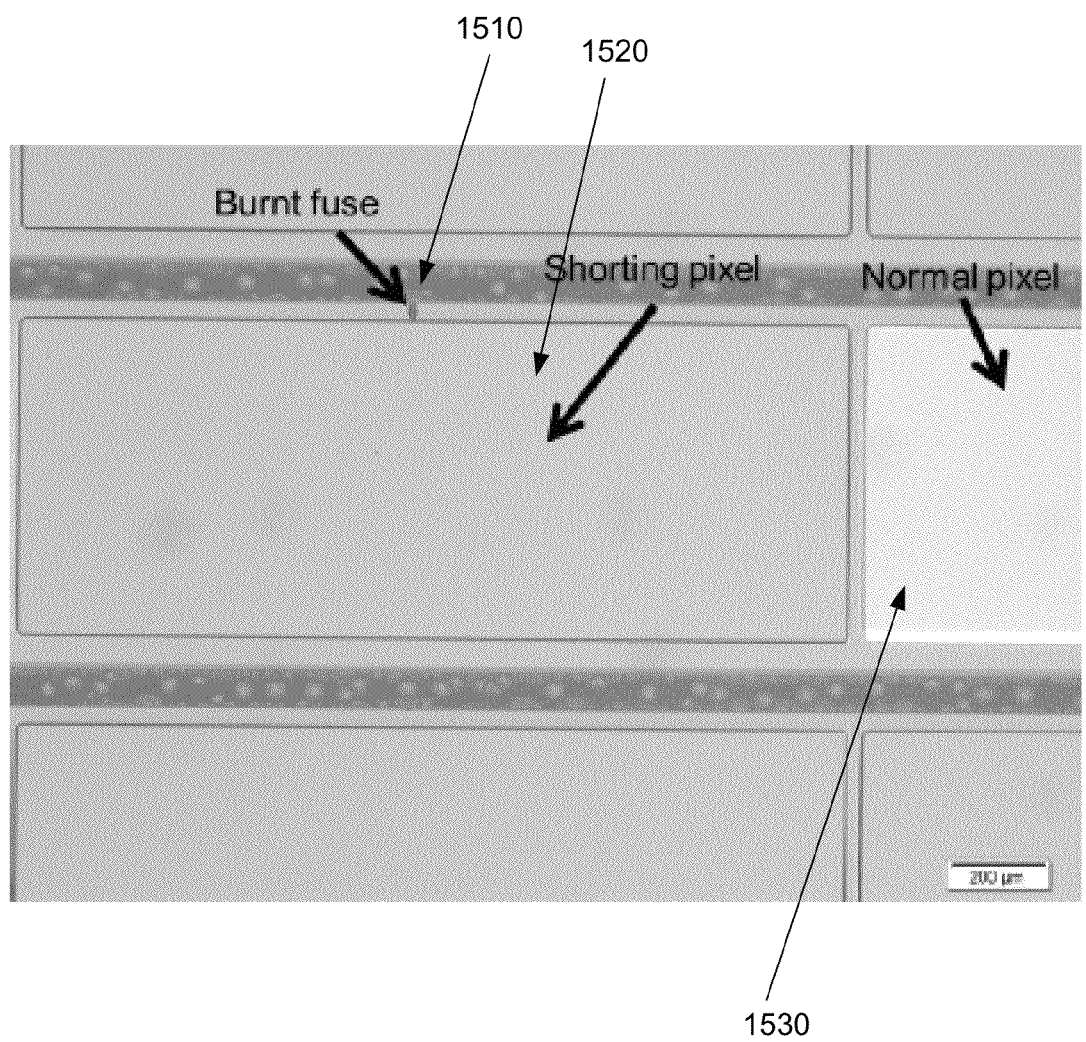
FIG. 15 shows a microscopic image of the panel during operation, which includes a shorting pixel and a normal-operating pixel.
Figure 16:
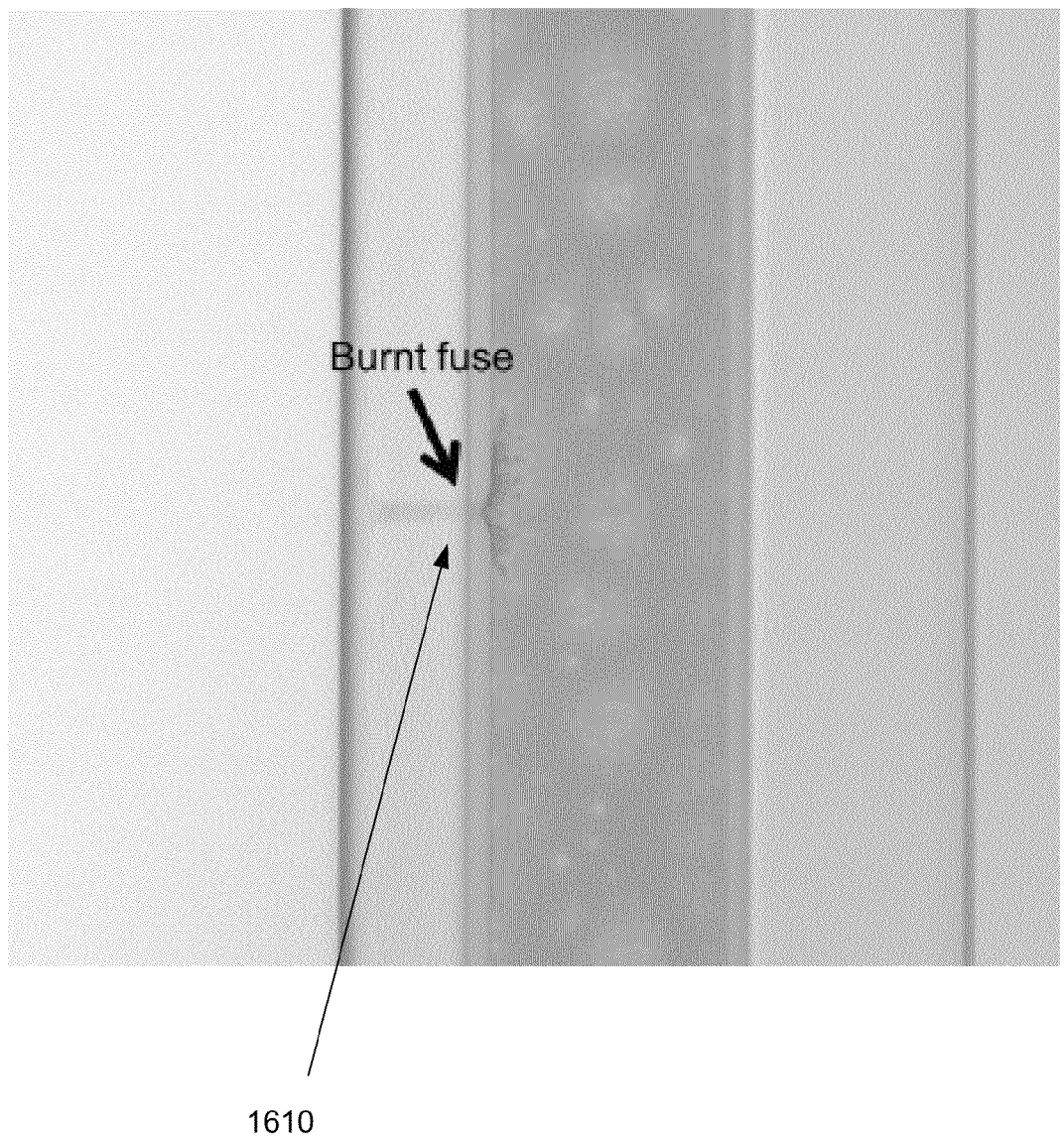
FIG. 16 shows a close-up microscopic image of the burnt fuse.

FIG. 15 shows a microscopic image of the panel during operation, which includes a shorting pixel 1520 and a normal-operating pixel 1530. The fuse 1510 connected to the shorting pixel is burnt. FIG. 16 further shows a close-up microscopic image of the burnt fuse 1610. It can be seen that the melting of the fuse prevents the current flow from bus line to the active area and thus isolates the bad pixel. The fuse may open up the circuit by any means, such as melting, breaking, cracking, ablating, etc.

The luminance and CIE color coordinates of the panel was recorded at four driving conditions (labeled as 1-4) with the diffuser and block on top of the panel and is summarized in Table 1. The measurement was taken at normal incidence using a Minolta luminance meter. The red, green and blue light stripes were driven from individual power supplies. All the stripes of each color were connected in parallel and driven at the same time. For driving conditions 1 and 2, all three colors were lit up to generate a white emission. The panel successfully demonstrated a high luminance of 3,000 cd/m$^2$ with CIE of (0.400, 0.420) when the red stripes were driven at 355 mA, green stripes at 315 mA, and blue stripes at 263 mA, and a low luminance of 1130 cd/m$^2$ with almost the same CIE of (0.402, 0.418) when the red stripes were driven at 295 mA, green stripes at 133 mA, and blue stripes at 156 mA. This is an advantage from a color tunable panel over a single white lighting panel that uses a common white OLED structure across the entire active area: in the single white panel, the white point usually shifts at different luminance levels, while in the color tunable panel, red, green and blue emissions may be individually tuned to produce the substantially the same color at various luminance levels which is more desired in general lighting applications. On the other hand, individual colors may also be tuned to create different white points, e.g., from cool white (correlated color temperature CCT=5000 K) to a warm white (correlated color temperature CCT=3000 K). In condition 3, only red and green stripes were lit up at 1450 cd/m$^2$ by driving the red stripes at 385 mA and the green stripes at 350 mA, and a yellow color of (0.499, 0.496) was achieved. In condition 4, only red and blue stripes were illuminating at 2270 cd/m$^2$, with red stripes driven at 400 mA and blue stripes at 193 mA, and the color shifts to a pink hue of (0.521, 0.356). Note that these are just some examples of the driving configurations that can be used to tune the color and/or luminance of the panel. More generally, various combinations of the color stripes and driving conditions may be used to achieve a desired appearance of the panel. This data demonstrates that the panel is color tunable and dimmable, and maintains a decent integral appearance even when shorting presents.

Table 1 provides a summary of the luminance and CIE color coordinates of the example panel at 4 driving conditions. $I_R$, $I_G$, and $I_B$ represent the total current for driving all red, green and blue stripes, respectively.

TABLE 1

| | $I_R$ [mA] | $I_G$ [mA] | $I_B$ [mA] | Luminance [cd/m$^2$] | CIEx, y |
|---|---|---|---|---|---|
| 1 | 355 | 315 | 263 | 3000 | (0.400, 0.420) |
| 2 | 295 | 133 | 156 | 1130 | (0.402, 0.418) |
| 3 | 385 | 350 | — | 1450 | (0.499, 0.496) |
| 4 | 400 | — | 193 | 2270 | (0.521, 0.356) |

Conclusion

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

Although many embodiments were described above as comprising different features and/or combination of features, a person of ordinary skill in the art after reading this disclosure may understand that in some instances, one or more of these components could be combined with any of the components or features described above. That is, one or more features from any embodiment can be combined with one or more features of any other embodiment without departing from the scope of the invention.

As noted previously, all measurements, dimensions, and materials provided herein within the specification or within the figures are by way of example only.

A recitation of "a," "an," or "the" is intended to mean "one or more" unless specifically indicated to the contrary. Reference to a "first" component does not necessarily require that a second component be provided. Moreover reference to a "first" or a "second" component does not limit the referenced component to a particular location unless expressly stated.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates, which may need to be independently confirmed.

What is claimed is:

1. A first device, comprising:
    a substrate;
    a plurality of conductive bus lines disposed over the substrate;
    a plurality of OLED circuit elements disposed on the substrate, wherein each of the OLED circuit elements comprises one and only one pixel electrically connected in series with a fuse;
    wherein each pixel further comprises:
    a first electrode;
    a second electrode; and
    an organic electroluminescent (EL) material disposed between said first and said second electrodes;
    wherein the fuse of each of the plurality of OLED circuit elements electrically connects each of the OLED circuit elements to at least one of the plurality of bus lines;
    wherein each of the plurality of bus lines is electrically connected to a plurality of OLED circuit elements that are commonly addressable; and
    wherein at least two of the bus lines are separately addressable.

2. The first device of claim 1, wherein the OLED circuit elements that are connected to the same bus line are electrically connected in parallel.

3. The first device of claim 1, wherein the organic EL material of each of the OLED circuit elements that are connected to the same bus line has an emission spectrum having a peak wavelength that is within 5% of one another.

4. The first device of claim 1, wherein the plurality of bus lines comprises at least a first bus line and a second bus line;
    wherein the first bus line is electrically connected to a first group of OLED circuit elements comprising an organic EL material having an emission spectrum that has a first peak wavelength;
    wherein the second bus line is electrically connected to a second group of OLED circuit elements comprising an organic EL material having an emission spectrum that has a second peak wavelength; and
    wherein the first peak wavelength and the second peak wavelength are different.

5. The first device of claim 4,
    wherein the fuse of each of the OLED circuit elements in the first group of OLED circuit elements has a first melting current;
    wherein the fuse of each of the OLED circuit elements in the second group of OLED circuit elements has a second melting current; and
    wherein the first and the second melting currents are within 5% of one another.

6. The first device of claim 4,
    wherein the fuse of each of the OLED circuit elements in the first group of OLED circuit elements has a first melting current;
    wherein the fuse of each of the OLED circuit elements in the second group of OLED circuit elements has a second melting current;
    wherein the first melting current and the second melting current are between 0.1 mA and 50 mA.

7. The first device of claim 4,
    wherein the fuse of each of the OLED circuit elements in the first group of OLED circuit elements has a first melting current;
    wherein the fuse of each of the OLED circuit elements in the second group of OLED circuit elements has a second melting current; and
    wherein the first and the second melting currents are at least 5% different.

8. The first device of claim 1,
    wherein the plurality of bus lines comprises at least a first bus line, a second bus line, and a third bus line;
    wherein the first bus line is electrically connected to a first group of OLED circuit elements comprising an organic EL material having an emission spectrum that has a first peak wavelength;
    wherein the second bus line is electrically connected to a second group of OLED circuit elements comprising an organic EL material having an emission spectrum that has a second peak wavelength; and
    wherein the third bus line is electrically connected to a third group of OLED circuit elements comprising an organic EL material having an emission spectrum that has a third peak wavelength.

9. The first device of claim 8,
    wherein the fuse of each of the OLED circuit elements in the first group of OLED circuit elements has a first melting current;
    wherein the fuse of each of the OLED circuit elements in the second group of OLED circuit elements has a second melting current;
    wherein the fuse of each of the OLED circuit elements in the third group of OLED circuit elements has a third melting current; and wherein the first, the second, and the third melting currents are within 5% of one another.

10. The first device of claim 8,
wherein the fuse of each of the OLED circuit elements in the first group of OLED circuit elements has a first melting current;
wherein the fuse of each of the OLED circuit elements in the second group of OLED circuit elements has a second melting current;
wherein the fuse of each of the OLED circuit elements in the third group of OLED circuit elements has a third melting current; and
wherein the first melting current, the second melting current, and the third melting current are between 0.1 mA and 50 mA.

11. The first device of claim 8,
wherein the fuse of each of the OLED circuit elements in the first group of OLED circuit elements has a first melting current;
wherein the fuse of each of the OLED circuit elements in the second group of OLED circuit elements has a second melting current;
wherein the fuse of each of the OLED circuit elements in the third group of OLED circuit elements has a third melting current; and
wherein the first, the second, and the third melting currents are at least 5% different.

12. The first device of claim 11,
wherein the first melting current and the second melting current are at least 10% different;
wherein the first melting current and the third melting current are at least 10% different; and
wherein the second melting current and the third melting current are at least 10% different.

13. The first device of claim 11, wherein the first melting current, the second melting, and the third melting current are at least 30% different.

14. The first device of claim 8, further comprising a fourth bus line, wherein the fourth bus line is electrically connected to a fourth group of OLED circuit elements comprising an organic EL material having an emission spectrum that has a fourth peak wavelength.

15. The first device of claim 1,
wherein the plurality of bus lines comprises at least a first bus line and a second bus line;
wherein the first bus line is electrically connected to a first group of OLED circuit elements comprising an organic EL material having an emission spectrum that has a first peak wavelength;
wherein the second bus line is electrically connected to a second group of OLED circuit elements comprising an organic EL material having an emission spectrum that has a second peak wavelength;
wherein the first peak wavelength and the second peak wavelength are different;
wherein the first device is configured to drive each of the plurality of OLED circuit elements at a plurality of luminance levels; and
wherein the plurality of luminance levels comprises a minimum luminance level and a maximum luminance level.

16. The first device of claim 15,
wherein the maximum luminance level is at least N times greater than the minimum luminance level; and
wherein the first group of OLED circuit elements and the second group of OLED circuit elements each comprises at least N OLED circuit elements.

17. The first device of claim 16, wherein the first group of OLED circuit elements and the second group of OLED circuit elements each comprises at least 2*N OLED circuit elements.

18. The first device of claim 15,
wherein the maximum luminance level is at least two times greater than the minimum luminance level; and
wherein the first group of OLED circuit elements and the second group of OLED circuit elements each comprises at least 2 OLED circuit elements.

19. The first device of claim 15,
wherein the maximum luminance level is at least five times greater than the minimum luminance level; and
wherein the first group of OLED circuit elements and the second group of OLED circuit elements each comprises at least 5 OLED circuit elements.

20. The first device of claim 1,
wherein the plurality of bus lines comprises a first group of commonly addressable bus lines and a second group of commonly addressable bus lines;
wherein each of the bus lines of the first group of commonly addressable bus lines is electrically connected to a first group of OLED circuit elements comprising an organic EL material having an emission spectrum that has a first peak wavelength;
wherein each of the bus lines of the second group of commonly addressable bus lines is electrically connected to a second group of OLED circuit elements comprising an organic EL material having an emission spectrum that has a second peak wavelength; and
wherein the first peak wavelength and the second peak wavelength are different.

* * * * *